(12) United States Patent
Konrath et al.

(10) Patent No.: US 11,842,938 B2
(45) Date of Patent: *Dec. 12, 2023

(54) SEMICONDUCTOR DEVICE AND METHOD FOR FORMING A SEMICONDUCTOR DEVICE

(71) Applicant: Infineon Technologies AG, Neubiberg (DE)

(72) Inventors: Jens Peter Konrath, Villach (AT); Wolfgang Bergner, Klagenfurt (AT); Romain Esteve, Munich (DE); Richard Gaisberger, Velden (AT); Florian Grasse, Hohenthurn (AT); Jochen Hilsenbeck, Villach (AT); Ravi Keshav Joshi, Klagenfurt (AT); Stefan Kramp, Villach (AT); Stefan Krivec, Arnoldstein (AT); Grzegorz Lupina, Villach (AT); Hiroshi Narahashi, Villach (AT); Andreas Voerckel, Finkenstein (AT); Stefan Woehlert, Villach (AT)

(73) Assignee: Infineon Technologies AG, Neubiberg (DE)

( * ) Notice: Subject to any disclaimer, the term of this patent is extended or adjusted under 35 U.S.C. 154(b) by 39 days.

This patent is subject to a terminal disclaimer.

(21) Appl. No.: 17/538,162

(22) Filed: Nov. 30, 2021

(65) Prior Publication Data

US 2022/0093483 A1   Mar. 24, 2022

Related U.S. Application Data

(63) Continuation of application No. 16/379,289, filed on Apr. 9, 2019, now Pat. No. 11,217,500.

(30) Foreign Application Priority Data

Apr. 10, 2018 (DE) .......................... 102018108444.7
Jan. 4, 2019 (DE) .......................... 102019100130.7

(51) Int. Cl.
*H01L 23/31* (2006.01)
*H01L 23/29* (2006.01)
(Continued)

(52) U.S. Cl.
CPC .......... *H01L 23/3192* (2013.01); *H01L 21/56* (2013.01); *H01L 21/76841* (2013.01);
(Continued)

(58) Field of Classification Search
None
See application file for complete search history.

(56) References Cited

U.S. PATENT DOCUMENTS 5,284,801 A     2/1994  Page et al.
7,851,881 B1 * 12/2010 Zhao ................... H01L 29/0619
                                                            257/155

(Continued)

*Primary Examiner* — Khaja Ahmad
(74) *Attorney, Agent, or Firm* — Murphy, Bilak & Homiller, PLLC

(57) ABSTRACT

A semiconductor device includes a contact metallization layer that includes aluminum and is arranged on a semiconductor substrate, an inorganic passivation structure arranged on the semiconductor substrate, an organic passivation layer comprising a first part that is arranged on the contact metallization layer, and a second part that is arranged on the inorganic passivation structure, a first layer structure including a first part that is in contact with the contact metallization layer, a second part that is contact with the inorganic passivation structure, and a third part that is disposed on the semiconductor substrate laterally between the inorganic passivation structure and the organic passivation layer.

18 Claims, 16 Drawing Sheets

(51) Int. Cl.
*H01L 21/56* (2006.01)
*H01L 29/16* (2006.01)
*H01L 29/861* (2006.01)
*H01L 29/78* (2006.01)
*H01L 21/768* (2006.01)
*H01L 23/532* (2006.01)

(52) U.S. Cl.
CPC .......... *H01L 23/291* (2013.01); *H01L 23/293* (2013.01); *H01L 23/3171* (2013.01); *H01L 23/53223* (2013.01); *H01L 29/1608* (2013.01); *H01L 29/7811* (2013.01); *H01L 29/8611* (2013.01)

(56) References Cited

U.S. PATENT DOCUMENTS

| | | |
|---|---|---|
| 2004/0207092 A1* | 10/2004 | Burrell .............. H01L 23/53228 257/E21.582 |
| 2006/0086939 A1 | 4/2006 | Carta et al. |
| 2006/0145283 A1 | 7/2006 | Zhu et al. |
| 2010/0025820 A1 | 2/2010 | Suekawa |
| 2011/0248284 A1* | 10/2011 | Carta ................. H01L 29/1608 257/77 |
| 2013/0062723 A1* | 3/2013 | Henning ............ H01L 29/0619 257/E29.338 |
| 2015/0091161 A1 | 4/2015 | Tomita |
| 2015/0255362 A1* | 9/2015 | Konrath ............ H01L 29/66901 257/272 |
| 2015/0357405 A1 | 12/2015 | Ueda et al. |
| 2016/0276448 A1 | 9/2016 | Ohara et al. |
| 2018/0158914 A1 | 6/2018 | Kitamura et al. |
| 2018/0350900 A1 | 12/2018 | Nakamata et al. |
| 2019/0148165 A1 | 5/2019 | He et al. |

* cited by examiner

SEMICONDUCTOR DEVICE AND METHOD FOR FORMING A SEMICONDUCTOR DEVICE

TECHNICAL FIELD

Examples relate to passivation concepts for semiconductor devices, and, in particular, to a semiconductor device and a method for forming a semiconductor device.

BACKGROUND

Semiconductor devices may experience very high electric fields at the surface of the edge termination region such that a passivation with a material comprising a good breakdown resistance may be required. Solutions using organic passivation are susceptible to gathering moisture and may cause corrosion. Solutions using inorganic passivation may be susceptible to thermo-mechanical stress. In this context, if the inorganic passivation is in contact with the metallization layer and this arrangement is exposed to thermo-mechanical stress, cracks may occur.

Therefore, passivation taking into account high electric fields, moisture, and mechanical stress is important for the breakdown behavior and long-term reliability of semiconductor devices.

SUMMARY

There may be a demand to provide concepts for a passivation of semiconductor devices, which allow for improvements to the robustness and/or reliability of the semiconductor devices.

Examples relate to a semiconductor device comprising a contact metallization layer arranged on a semiconductor substrate, an inorganic passivation structure arranged on the semiconductor substrate, and an organic passivation layer. A part of the organic passivation layer located laterally between the contact metallization layer and the inorganic passivation structure is located vertically closer to the semiconductor substrate than a part of the organic passivation layer located on top of the inorganic passivation structure.

Further examples relate to a method of forming a semiconductor device. The method comprises forming a contact metallization layer on a semiconductor substrate and forming an inorganic passivation structure on the semiconductor substrate. Further, the method comprises forming an organic passivation layer. A part of the organic passivation layer located laterally between the contact metallization layer and the inorganic passivation structure is located vertically closer to the semiconductor substrate than a part of the organic passivation layer located on top of the inorganic passivation structure.

Those skilled in the art will recognize additional features and advantages upon reading the following detailed description, and upon viewing the accompanying drawings.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B, as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
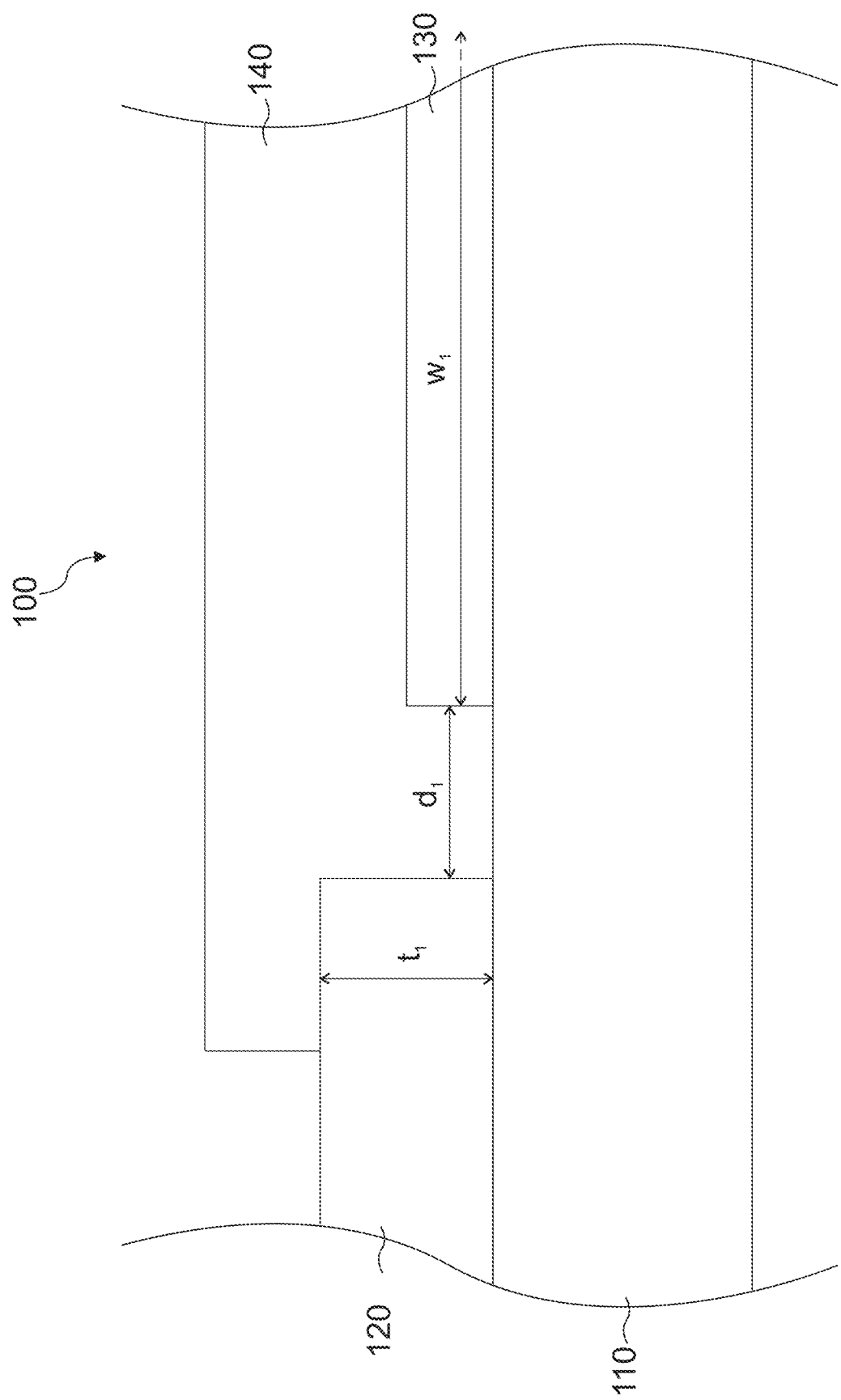
FIG. 1 shows a schematic cross-section of a part of a semiconductor device.

FIG. 1 shows a block diagram of a cross-section of a semiconductor device 100 according to an embodiment. The semiconductor device 100 comprises a contact metallization layer 120 arranged on a semiconductor substrate 110, an inorganic passivation structure 130, and an organic passivation layer 140. A (first) part of the organic passivation layer 140 is located laterally between the contact metallization layer 120 and the inorganic passivation structure 130 and a (second) part of the organic passivation layer 140 is located on top of the inorganic passivation structure 130. The first part of the organic passivation layer is located vertically closer to the semiconductor substrate 110 than the second part of the organic passivation layer. Further, a third part of the organic passivation layer 140 is located on top of the contact metallization layer 120.

The layout may be chosen such that a sufficiently large gap between the contact metallization layer 120 and the inorganic passivation structure 130 may be implemented. Due to the gap between the contact metallization layer 120 and the inorganic passivation structure 130, parts of the organic passivation layer 140 within the gap between the contact metallization layer 120 and the inorganic passivation structure 130 are closer to the semiconductor substrate 110 than parts of the organic passivation layer 140 formed on top of the inorganic passivation structure 130. Due to the gap between the contact metallization layer 120 and the inorganic passivation structure 130, damage during manufacturing or operation of the semiconductor device may be reduced or avoided. In contrast, if the inorganic passivation layer 130 was guided over or was in contact with the contact metallization layer 120, cracks would be more likely to occur, for example, caused by varying temperature. However, if the inorganic passivation structure 130 is chosen such that there is a gap between the inorganic passivation structure 130 and the contact metallization layer 120, then the stress in the layer stack on the semiconductor substrate may be reduced. In this way, the robustness and/or reliability of the semiconductor device may be improved.

The contact metallization layer 120 and the inorganic passivation structure 130 may be spaced apart from each other so that a lateral gap between the contact metallization layer 120 and the inorganic passivation structure 130 is at least partly filled by the organic passivation layer 140. A lateral distance d1 between the contact metallization layer 120 and the inorganic passivation structure 130 may be larger than (or larger than two times, or larger than 3 times) the vertical thickness t1 of the contact metallization layer 120. Additionally, or alternatively, the lateral distance d1 between the contact metallization layer 120 and the inorganic passivation structure 130 may be smaller than the width w1 of the inorganic passivation structure 130 (or smaller than 50% of the width or smaller than 30% of the width). The width of the inorganic passivation structure 130 may be a minimal lateral dimension or a lateral dimension measured in a direction orthogonal to an edge of the semiconductor substrate 110 at a center of the edge. For example, the lateral distance between the inorganic passivation structure and an edge of the semiconductor substrate may be larger than 10 μm (or 20 μm or 50 μm). In this way, the semiconductor substrate 110 may be cut during manufacturing of the semiconductor device without the need to cut through the passivation structure, which might lead to cracks or sticking effects to a saw blade.

The first part of the organic passivation layer 140 located laterally between the contact metallization layer 120 and the inorganic passivation structure 130 may be in contact with the semiconductor substrate 110 or one or more layers may be located vertically between the first part and the semiconductor substrate 110. One or more optional layers may be located vertically between the first part and the semiconductor substrate 110, which may comprise a thickness smaller than a thickness of the inorganic passivation structure 130.

The organic passivation layer 140 may be formed after the contact metallization layer 120 so that the third part of the organic passivation layer 140 is located on top of the contact metallization layer 120. For example, the contact metallization layer 120 is located vertically closer to the semiconductor substrate 110 than the third part of the organic passivation layer 140. For example, no part of the organic passivation layer 140 is located beneath the contact metallization layer 120. The organic passivation layer 140 may extend from the second part to the third part with the first part being located laterally between the second part and the third part of the organic passivation layer 140. The organic passivation layer 140 may be manufacturable or manufactured in a single manufacturing process (e.g. by deposition), which is not interrupted by a formation of another layer. For example, the whole organic passivation layer 140 may be formed after forming the contact metallization layer 120.

The thickness of the inorganic passivation structure 130 may be larger than 500 nm (or larger than 750 nm or larger than 1 μm) and/or less than 6 μm (or less than 3 μm or less than 1 μm). The inorganic passivation structure may be a single layer or may comprise two or more sublayers. For example, the inorganic passivation structure 130 may be or may comprise an oxide layer (e.g. silicon oxide layer, undoped silica glass (USG) layer or borophosphosilicate glass (BPSG) layer), which may comprise a thickness larger than 300 nm (or larger than 500 nm or larger than 750 nm) and/or smaller than 5 μm (or smaller than 3 μm or smaller than 1 μm). Alternatively or additionally, the inorganic passivation structure 130 may be or may comprise a nitride layer (e.g. silicon nitride layer), which may comprise a thickness larger than 400 nm (or larger than 500 nm or larger than 600 nm) and/or smaller than 800 nm (or smaller than 700 nm or smaller than 600 nm).

By choosing an appropriate thickness and/or material of the inorganic passivation structure 130 the semiconductor device may be configured such that an electric field at the surface of the inorganic passivation structure 130 (e.g. interface between inorganic passivation structure and organic passivation layer) may be larger than 500 kV/cm (or larger than 600 kV/cm or larger than 800 kV/cm) in a blocking state of an electrical structure (e.g. diode structure or transistor structure) formed at the semiconductor substrate 110.

The thickness of the organic passivation layer 140 may be chosen such that thermal stress can be compensated or absorbed without resulting in crack formation, and/or electric fields at a surface of the organic passivation layer 140 may be below a threshold. The thickness and/or material of the organic passivation structure 140 may be configured such that an electric field at a surface of the organic passivation layer 140 (e.g. at an interface between the organic passivation layer and a mold compound) may be lower than 500 kV/cm (or lower than 400 kV/cm or lower than 300 kV/cm) in a blocking state of an electrical structure formed at the semiconductor substrate 110. The organic passivation layer 140 may be a single layer or may comprise two or more sublayers. For example, the organic passivation layer 140 may be a polyimide layer. The organic passivation layer 140 may have a thickness of more than 1 μm (or more than 3 µm or more than 5 µm) and/or less than 50 µm (or less than 30 µm or less than 15 µm).

The contact metallization layer 120 may be a single layer or may comprise two or more sublayers. The contact metallization layer 120 may comprise a metal layer. For example, the contact metallization layer 120 may comprise copper (Cu) or aluminum (Al), or may comprise an alloy of aluminum and copper (e.g. AlCu or AlCuSi). The contact metallization layer 120 may comprise a thickness of more than 2 µm (or more than 3 µm or more than 4 µm) and/or less than 20 µm (or less than 10 µm or less than 6 µm).

Optionally, the semiconductor device 100 may further comprise a barrier layer to prevent atoms of the contact metallization layer 120 from diffusing into the semiconductor substrate 110. The barrier layer may comprise a first part arranged vertically between the contact metallization layer 120 and the semiconductor substrate 110. Further, the first part of the barrier layer may be in contact with the contact metallization layer 120 and the semiconductor substrate 110. The barrier layer may comprise a second part arranged between the inorganic passivation structure 130 and the semiconductor substrate 110. For example, the second part of the barrier layer may be in contact with the inorganic passivation structure 130 and the semiconductor substrate 110. The barrier layer may extend at least from the first part of the barrier layer to the second part of the barrier layer. In this way, the barrier layer may be used as an etch stop layer during the structuring of the inorganic passivation structure 130. The barrier layer may be or may comprise a titanium (Ti) layer, a titanium nitride (TiN) layer and/or a tantalum (Ta) layer. The barrier layer may have a thickness larger than 100 nm (or larger than 150 nm or larger than 200 nm) and less than 300 nm (or less than 250 nm or less than 200 nm).

The barrier layer may comprise a first sublayer (e.g. barrier sublayer), also referred as Schottky barrier, and a second sublayer (e.g. buffer sublayer), e.g. an etchant barrier and/or buffer. The first sublayer may be in contact with the semiconductor substrate and may prevent atoms (e.g. metal atoms like aluminum or copper) from layers above the first sublayer from diffusing into the semiconductor substrate. The second sublayer may be in contact with the first sublayer and the contact metallization layer 120. The second sublayer may prevent particles used in the etching processes (e.g. those described with regards to the passivation structure) from penetrating the first sublayer by absorbing and/or trapping the etch particles. The first sublayer may comprise titanium (e.g. a titanium layer) and the second sublayer may comprise a titanium aluminum alloy (e.g. a TiAl3-layer) or titanium nitride (e.g. a TiN layer).

Some examples relating to a diode structure are discussed in more detail with respect to FIGS. 2-6F.

Some examples relate to a transistor structure (e.g. insulated gate field effect transistor (IGFET), metal-oxide-semiconductor field effect transistor (MOSFET) or insulated gate bipolar transistor (IGBT)) as shown in FIGS. 7A-8C. In some examples where the semiconductor device is a MOSFET (or IGFET or IGBT), the MOSFET may further comprise an intermediate oxide layer (e.g. silicon dioxide layer). For example, the intermediate oxide layer may be arranged directly on the semiconductor substrate (in contact with the semiconductor substrate). The intermediate oxide layer may comprise a first sublayer being a part of a gate oxide layer and a second sublayer being an inter-layer dielectric layer formed on the gate oxide layer.

For example, a first lateral part of the intermediate oxide layer may be arranged vertically between the contact metallization layer and the semiconductor substrate and a second lateral part of the intermediate oxide layer may be arranged vertically between the inorganic passivation structure and the semiconductor substrate. The intermediate oxide layer may extend at least from the first part to the second part.

For example, the inorganic passivation structure 130 may comprise a nitride layer (e.g. silicon nitride layer). The first part of the organic passivation layer 140 (e.g. the part located laterally between the inorganic passivation structure 130 and the contact metallization layer 120) may be located vertically closer to the intermediate oxide layer 731 than the second part of the organic passivation layer 140 (e.g. the part located on the inorganic passivation structure 130). In this example, the intermediate oxide layer may be used as etch stop layer for structuring the nitride layer. An example is discussed in more detail with respect to FIGS. 7A-7C.

Alternatively, the first part of the barrier layer may be arranged vertically between the intermediate oxide layer and the contact metallization layer and the second part of the barrier layer may be arranged vertically between the inorganic passivation structure and the intermediate oxide layer. In this example, the inorganic passivation structure 130 may comprise a silicon oxide layer, such as but not limited to undoped silicate glass layer, borophosphosilicate glass, phosphosilicate glass and borosilicate glass and/or a silicon nitride layer. The silicon oxide layer may be arranged vertically between the silicon nitride layer and the intermediate oxide layer. The barrier layer may be used as etch stop layer for structuring the silicon oxide layer and a silicon nitride layer. An example is discussed in more detail with respect to FIGS. 8A-8C.

Optionally, the semiconductor device 100 may further comprise an adhesion layer, for example, to increase an adhesion of the organic passivation layer 140 on top of the inorganic passivation structure 130 and/or contact metallization layer 120. The adhesion layer may comprise a first part arranged between the contact metallization layer 120 and the organic passivation layer 140. For example, the first part of the adhesion layer may be in contact with the contact metallization layer 120 and the organic passivation layer 140. The adhesion layer may comprise a second part arranged between the inorganic passivation structure 130 and the organic passivation layer 140. For example, the second part of the adhesion layer may be in contact with the inorganic passivation structure 130 and the organic passivation layer 140. The adhesion layer may extend at least from the first part to the second part so that the adhesion layer may improve the adhesion of the organic passivation layer 140 in the gap between the contact metallization layer 120 and the inorganic passivation layer 130 as well. The adhesion layer may comprise a thickness larger than 10 nm (or larger than 20 nm or larger than 30 nm) and less than 100 nm (or less than 60 nm or less than 40 nm). The adhesion layer may be a silicon nitride layer, for example.

Optionally, a bond wire or solder material (e.g. solder ball, solder bump or already soldered material) may be in contact with the contact metallization layer 120. Optionally, the semiconductor device 100 may further comprise a mold compound structure in contact with the organic passivation layer 140. For example, a mold compound is formed on the semiconductor substrate of the semiconductor device 100 after forming the organic passivation structure and after bonding a bond wire to the contact metallization layer 120 or soldering a solder structure to the contact metallization layer 120 to connect the semiconductor substrate to a lead frame or a package carrier of the semiconductor device 100.

The mold compound may be an epoxy-based mold compound or a soft mold compound.

For example, one or more electrical structures may be implemented at the semiconductor substrate 100. An electrical structure may be a diode structure (e.g. a vertical diode structure) or a transistor structure (e.g. vertical transistor structure) as for example a MOSFET or an IGBT. For example, the electrical structure may be a vertical diode structure or a vertical transistor structure with a lightly doped drift region.

For example, the semiconductor device 100 may comprise a drift region of an electrical structure comprising dopants of a first conductivity type. The semiconductor device 100 may comprise an edge termination region comprising dopants of a second conductivity type. The edge termination region may extend laterally from a contact region towards an edge of the semiconductor substrate 110 at least partially beneath the inorganic passivation structure 130. The edge termination region may be ohmically connected with the contact metallization layer 120 through the contact region. Two structures may be ohmically connected, if an ohmic path or connection exists between the two structures. The contact region may be a highly doped portion of the edge termination region or of a doped region of an electrical structure (e.g. anode or cathode region of a diode structure or source or body region of a transistor structure) to enable an ohmic contact to the contact metallization layer 120 or a wiring structure connected to the contact metallization layer 120.

The edge termination region may be chosen such that a lateral distance between the inorganic passivation structure 130 and the edge of the semiconductor substrate 110 is smaller than (e.g. more than 1 µm, more than 5 µm or more than 10 µm smaller than) the lateral distance between the edge termination doping region and the edge of the semiconductor substrate 110. Therefore, the edge termination region may be completely covered by the inorganic passivation structure 130 or may be covered at least at the part located close to the edge of the semiconductor substrate 110. In this way, corrosion of the edge termination region may be prevented by the inorganic passivation structure 130 covering.

The edge termination region may be a depletable doped region comprising an average doping concentration, so that the lightly p-doped edge termination region is depletable if a maximal blocking voltage is applied to the semiconductor device 100 during normal operation of the semiconductor device 100.

The drift region comprises dopants of the first conductivity type which can be a p-doping (e.g. caused by incorporating aluminum ions or boron ions) or an n-doping (e.g. caused by incorporating nitrogen ions, phosphor ions or arsenic ions). Consequently, the second conductivity type indicates the opposite type, n-doping or p-doping. In other words, the first conductivity type may indicate an n-doping and the second conductivity type may indicate a p-doping or vice-versa.

A doped anode region or doped cathode region of a diode structure and/or a doped source region and/or a doped body region of a transistor structure and/or the edge termination region of the semiconductor device 100 may be located at a front side or front side surface of the semiconductor substrate 100. A doped drain region or a doped emitter or collector region of the transistor structure may be located at a back side or back side surface of the semiconductor substrate 100.

A front side or front side surface of the semiconductor substrate 110 may be a semiconductor surface of the semiconductor substrate 110 towards metal layers, insulation layers or passivation layers on top of the semiconductor surface. In comparison to a basically vertical edge (e.g. resulting from separating the semiconductor substrate from others) of the semiconductor substrate 100, the front side surface of the semiconductor substrate 110 may be a substantially horizontal surface extending laterally. The front side surface of the semiconductor substrate 110 may be a substantially even plane (e.g. neglecting unevenness of the semiconductor structure due to the manufacturing process or trenches). The front side surface of the semiconductor substrate 110 may be a surface of the semiconductor substrate 110 used for forming more complex structures (e.g. gates, source regions and/or body regions of transistors, wiring layer stack) than at a back side of the semiconductor substrate 110.

A lateral direction or lateral expansion may be oriented substantially in parallel to the front side surface and a vertical direction or vertical expansion may be oriented basically orthogonal to the front side surface. For example, the vertical direction and a vertical dimension or thicknesses of layers may be measured orthogonal to the front side surface of the semiconductor substrate and a lateral direction and lateral dimensions may be measured in parallel to the front side surface of the semiconductor substrate.

For example, the semiconductor substrate 110 may be a wide band gap semiconductor substrate having a band gap larger than the band gap of silicon (1.1 eV). For example, the semiconductor substrate 110 may be a silicon carbide (SiC)-based semiconductor substrate, or gallium arsenide (GaAs)-based semiconductor substrate, or a gallium nitride (GaN)-based semiconductor substrate. The semiconductor substrate 110 may be a semiconductor wafer or a semiconductor die. Although a silicon carbide substrate is discussed in relation to the accompanying figures and embodiments, it should be appreciated that such embodiments are not intended to be limited to a SiC substrate only, and that other substrates, such as a GaAs or GaN based substrate are also possible.

A transistor structure (e.g. IGFET, MOSFET, or IGBT) of the semiconductor device 100 may be a vertical transistor structure conducting current between a front side surface of the semiconductor substrate and a back side surface of the semiconductor substrate. For example, the transistor arrangement of the semiconductor device may comprise a plurality of doped source regions connected to a source wiring structure, a plurality of gate electrodes or a gate electrode grid connected to a gate wiring structure and a back side drain metallization.

The transistor structure may be a transistor cell of a plurality of transistor cells of a transistor arrangement. A transistor cell may comprise one or more source regions (e.g. distributed or located along a gate), at least one body region and a gate (e.g. a trench gate located within a gate trench extending into the semiconductor substrate), for example, Further, the transistor cells of the plurality of transistor cells may share a common (mutual) drift region and/or a common drain region (e.g. the transistor cells are MOSFET cells) or a common collector region (e.g. the transistor cells are IGBT cells).

The semiconductor substrate may comprise a cell region (or active region) laterally surrounded by an edge termination region. The cell region may be a region of the semiconductor substrate used to conduct more than 90% of a current through the semiconductor substrate in an on-state or conducting state of the transistor arrangement (or the whole semiconductor device). For example, the cell region may be an area containing all source regions of the transistor arrangement or of all transistor structures of the semiconductor device. The edge termination region may be located between an edge of the semiconductor substrate and the cell region in order to support or block or reduce or dissipate a maximal voltage applied between the front side surface of the semiconductor substrate and a back side surface of the semiconductor substrate within the cell region laterally towards the edge of the semiconductor substrate.

The semiconductor device 100 may be a power semiconductor device. The semiconductor device may further comprise an electrical structure formed at the semiconductor substrate 110 (e.g. a transistor structure and/or a diode structure) having a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

The organic passivation layer 140 may continuously cover the inorganic passivation layer 130 as well as at least parts of the contact metallization layer 120.

More details and aspects are mentioned in connection with the examples described above or below. The semiconductor device may comprise one or more additional optional features corresponding to one or more aspects of the proposed concept or one or more examples described below (e.g. FIGS. 2-9).

Figure 2:
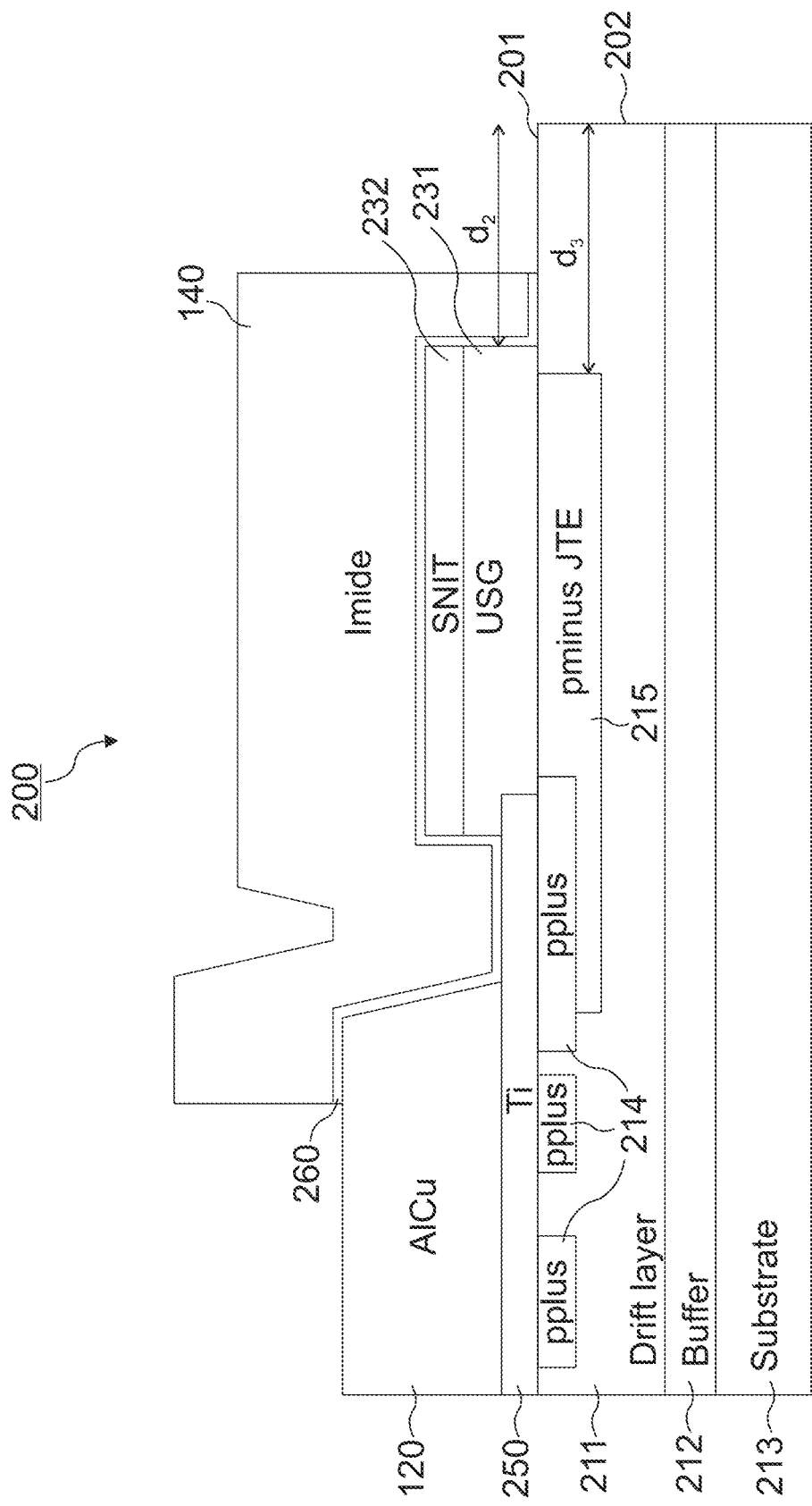
FIG. 2 shows a schematic cross-section of a part of a semiconductor device.

FIG. 2 shows a schematic cross-section of a semiconductor device 200 according to an embodiment. The implementation of the semiconductor device 200 may be similar to the implementation described in connection with FIG. 1. The organic passivation layer 140 (e.g. polyimide layer) is located closer than 300 nm to the semiconductor substrate in the gap between the contact metallization layer 120 (e.g. AlCu alloy layer) and the inorganic passivation structure 130. A barrier layer 250 (e.g. Ti layer) and a silicon nitride adhesion layer 260 are located vertically between the organic passivation layer 140 and the semiconductor substrate. The inorganic passivation structure 130 comprises two layers, a silicon oxide layer 231, and a silicon nitride layer 232. Although the silicon oxide layer 231 is represented by a USG layer in the image of FIG. 2, it should be appreciated that the silicon oxide layer 231 may alternatively comprise other silicon oxide layers, such as BPSG, BSG, and/or PSG. The organic passivation layer 140 extends laterally from a point between the edge 202 of the semiconductor device 200 and an edge of the inorganic passivation structure 130 to the contact metallization layer 120.

The barrier layer 250 has a first part located between the semiconductor substrate and contact metallization layer 120. The barrier layer 250 has a second part located between the semiconductor substrate and the silicon oxide layer 231. The barrier layer 250 extends from the first part to the second part continuously. The barrier layer 250 has a third part located between the adhesion layer 260 and the semiconductor substrate in the gap between the contact metallization layer 120 and the inorganic passivation structure 130.

The adhesion layer 260 has a first part that is located between the organic passivation layer 140 and the contact metallization layer 120. The adhesion layer 260 has a second part that is located between the organic passivation layer 140 and the silicon nitride layer 232. The adhesion layer 260 extends from the first part to the second part continuously. The adhesion layer 260 has a third part that is located between the organic passivation layer 140 and the barrier layer 250 in the gap between the contact metallization layer 120 and the inorganic passivation structure 130.

In this example, the semiconductor device is a SiC diode. The semiconductor substrate comprises a drift layer or doped drift region 211, a doped field stop region or buffer region 212, and a doped substrate region 213 forming an n-doped cathode region of the SiC diode. The buffer region comprises an average doping concentration higher than an average doping concentration of the drift region and the substrate region comprises an average doping concentration higher than the average doping concentration of the buffer region. Further, the semiconductor substrate comprises highly p-doped anode regions 214 located at the front side surface 201 of the semiconductor substrate. The highly p-doped anode regions 214 may be non-depletable doped regions comprising an average doping concentration, so that the anode regions 214 are not depletable if a maximal blocking voltage is applied to the semiconductor device 200 during normal operation of the semiconductor device 200.

Furthermore, the semiconductor substrate comprises a lightly p-doped edge termination region 215 extending at least partially beneath the inorganic passivation structure 130. The lateral distance d2 of the inorganic passivation structure 130 to the edge 202 is smaller than the lateral distance d3 of the edge termination region 215 to the edge 202 of the semiconductor device 200. The lightly p-doped edge termination region 215 may be a depletable region comprising an average doping concentration, so that the lightly p-doped edge termination region 215 is depletable if a maximal blocking voltage is applied to the semiconductor device 200 during normal operation of the semiconductor device 200. The lightly p-doped edge termination region 215 is connected to the contact metallization layer 120 through a highly p-doped anode region 214.

More details and aspects of the semiconductor device 200 are mentioned in connection with the proposed concept or one or more examples described above. The semiconductor device 200 may comprise one or more additional optional features corresponding to one or more aspects of the proposed concept or one or more examples described above (e.g. FIG. 1) or below (e.g. FIGS. 3-9).

Figure 3:
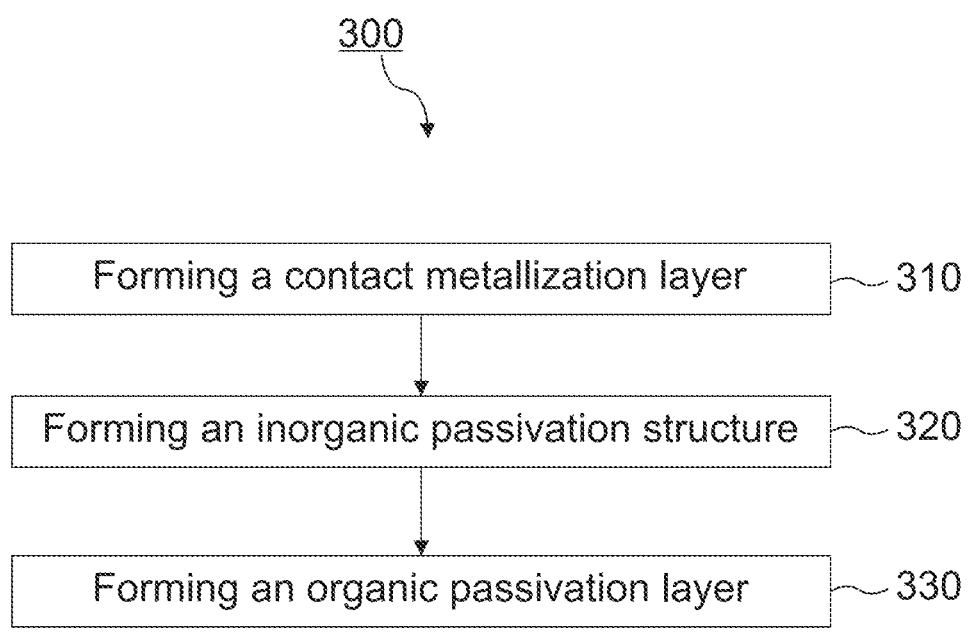
FIG. 3 shows a flowchart of a method for forming a semiconductor device.

FIG. 3 shows a flow chart of a method 300 for forming a semiconductor device according to an embodiment. The method 300 includes forming 310 a contact metallization layer on a semiconductor substrate, forming 320 an inorganic passivation structure on the semiconductor substrate, and forming 330 an organic passivation layer. A first part of the organic passivation layer located laterally between the contact metallization layer and the inorganic passivation structure is located vertically closer to the semiconductor substrate than a second part of the organic passivation layer located on top of the inorganic passivation structure. Further, a third part of the organic passivation layer is located on top of the contact metallization layer.

The layout may be chosen such that a sufficiently large distance between the contact metallization layer and the inorganic passivation structure may be implemented. Due to the distance between the contact metallization layer and the inorganic passivation structure, damages during manufacturing or operating the semiconductor device may be reduced or avoided. In this way, the robustness and/or reliability of the semiconductor device may be improved.

More details and aspects of the method 300 are mentioned in connection with the proposed concept or one or more examples described above. The method 300 may comprise one or more additional optional features corresponding to one or more aspects of the proposed concept or one or more examples described above (e.g. FIGS. 1-2) or below (e.g. FIGS. 4-9).

Figure 4:
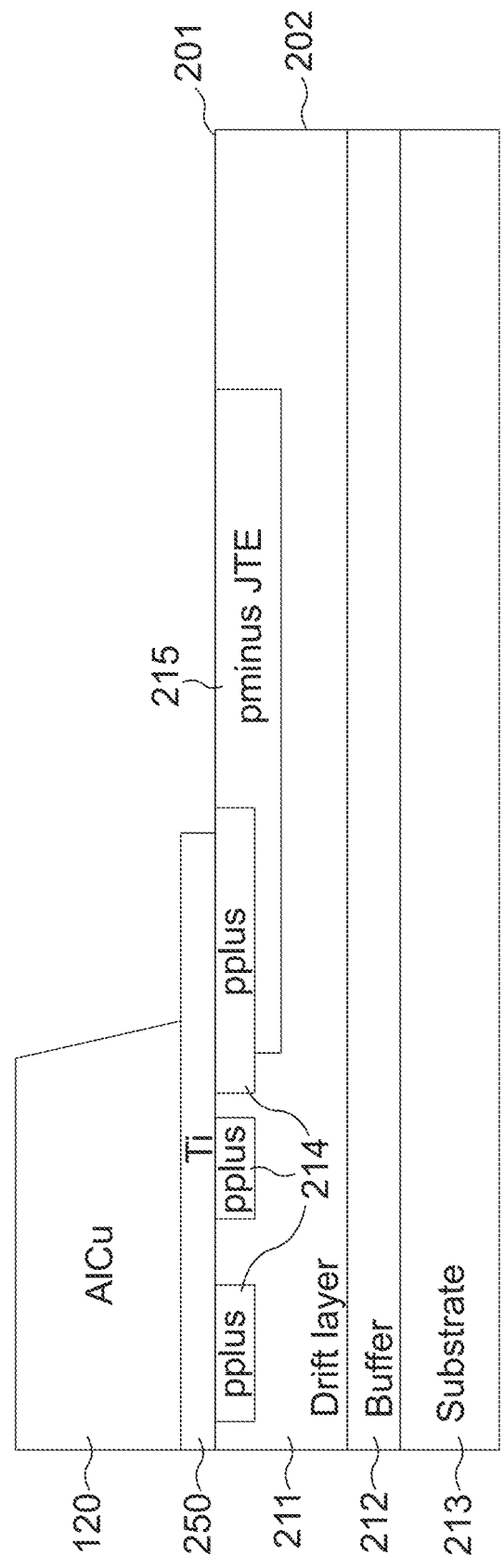
FIG. 4 shows a schematic cross-section of a semiconductor device after deposition of a contact metallization layer.
Figure 5:
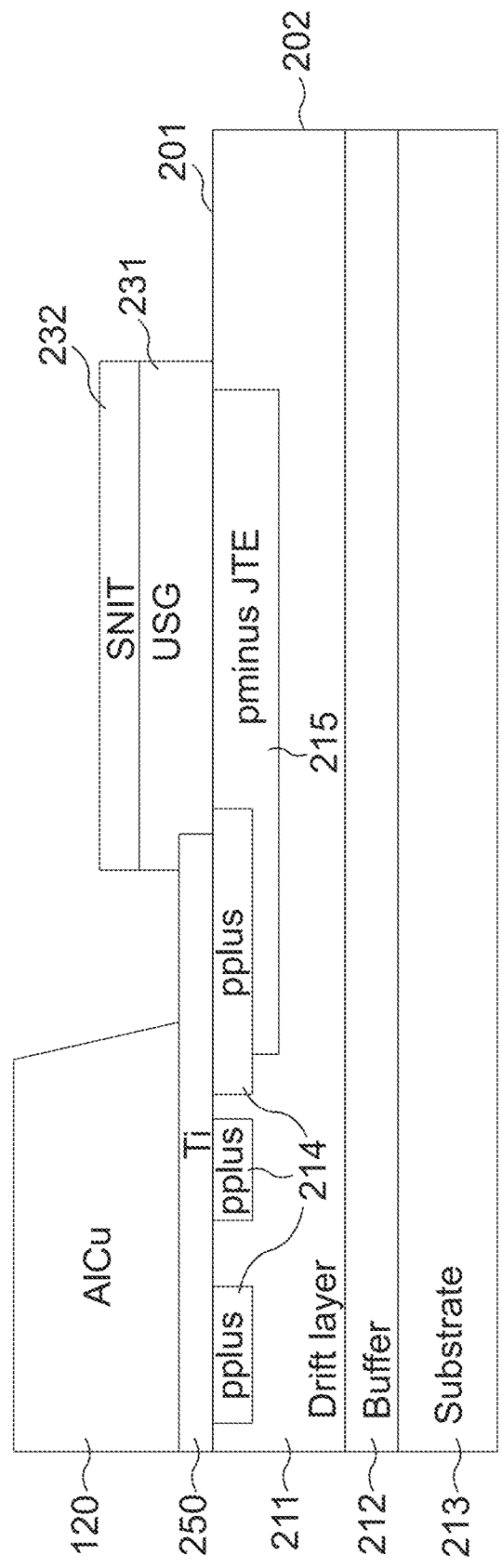
FIG. 5 shows a schematic cross-section of the semiconductor device of FIG. 4 after deposition of an inorganic passivation structure.

FIGS. 4 and 5 show schematic cross-sections of a SiC diode at different stages of manufacturing. The SiC diode shown in FIGS. 4 and 5 may be manufactured similar to the method described in connection with FIG. 3.

FIG. 4 shows a schematic cross-section of the SiC diode after forming doped regions (e.g. buffer region 212, drift region 211, anode regions 214 and doped edge termination region 215) of a diode structure in a semiconductor substrate of a semiconductor device to be formed. Further, a titanium barrier layer 250 is formed in contact with the semiconductor substrate and structured. FIG. 4 shows the SiC diode after deposition and structuring of the front side metallization (e.g. AlCu layer).

FIG. 5 shows a schematic cross-section of the SiC diode after deposition and structuring of inorganic passivation layers (e.g. a silicon oxide layer and a silicon nitride layer). The Ti barrier layer 250 is used as an etch stop between the front side metallization and an edge of the structured inorganic passivation layers during structuring the inorganic passivation layers.

As an example, FIG. 2 may show the SiC diode after forming (e.g. deposition and structuring) the organic passivation and opening (structuring) the optional silicon nitride adhesion layer 260.

After deposition and structuring of the front side metal (e.g. FIG. 4), the inorganic layer stack of the passivation is deposited. For example, the inorganic layer stack may comprise a silicon oxide/silicon nitride stack of which the silicon oxide thickness is measured such that the charges at the silicon oxide/silicon nitride interface might not influence the blocking behavior of the component (e.g. the charge ratios and field distributions in the edge termination). A BPSG/silicon nitride, silicon oxide/BPSG/silicon nitride or similar layer structure is also conceivable. After production of a resist mask, the inorganic passivation structure is structured in a subsequent process using a plasma etch process and the resist mask is removed (e.g. FIG. 5). Optionally, a thin adhesion layer, e.g. a thin silicon nitride layer, may be deposited and in a subsequent process a photosensitive organic passivation may be deposited which is structured and subsequently cured using a lithographic step. This organic passivation layer now serves as an etch mask for structuring the adhesion layer (optionally) in order to open the front side metal in the area of the bond pad. A possible result is shown in FIG. 2.

As described in connection with FIGS. 2, 4, and 5, the passivation can be produced after the AlCu/Ti process blocks, wherein the layout may be chosen such that a sufficiently large distance between the AlCu edge and the passivation is ensured. By reducing the thickness of the inorganic passivation structure, stress-induced crack formation may be prevented from taking place. However, in order for the electric field strength to continue to be compatible with the mold compound, an organic passivation is additionally deposited which also absorbs part of the mechanical stress.

For example, the amount of the electric field strength at the interface of the inorganic and the organic passivation resulting from the thickness of the inorganic passivation may be >500 kV/cm. Then, the organic passivation may be dimensioned in a way that, at its surface representing the interface to the mold compound, the amount of the electric field strength is considerably reduced in order to prevent a degradation of the mold compound and/or flashovers in the same. In turn, the thickness of the organic passivation may be chosen such that the forces generated by thermal expansion do not result in crack formation in itself or the subsequent layers.

In this context, a sufficient gap between the edge of the front side metallization (anode, for example, Al-based) and the inorganic passivation may be implemented. If, e.g., the inorganic hard passivation is guided over the metal and if this arrangement is exposed to thermo-mechanical stress, cracks may occur in the passivation due to the plastic deformation of the Al(SiCu).

If the inorganic hard passivation is now chosen such that only the edge termination is covered, the face covered by inorganic hard passivation is thereby reduced and as such a reduction in stress in the SiC oxide nitride layer structure may be achieved.

In order to improve the adhesion of the organic passivation on the front side metal in this case, a thin adhesive layer may be provided which both partially covers the front side metal and partially or entirely covers the inorganic passivation.

More details and aspects of the method shown in FIGS. 4 and 5 are mentioned in connection with the proposed concept or one or more examples described above or below. The method may comprise one or more additional optional features corresponding to one or more aspects of the proposed concept or one or more examples described above (e.g. FIGS. 1-3) or below (e.g. FIGS. 6A-9).

For example, the inorganic passivation structure is deposited on a surface with high topology, if the contact metallization layer is formed before the inorganic passivation structure. On the other hand, the barrier layer, a sub-layer of the barrier layer, or an ohmic contact layer which enables an ohmic or Schottky contact between the contact metallization layer and the semiconductor substrate may be damaged during structuring of the inorganic passivation structure, if the inorganic passivation structure is formed before the contact metallization layer.

For example, for a SiC Schottky diode, the Schottky metal (e.g. also called Schottky metallization, Schottky barrier or Schottky layer) may degrade if dry chemical patterning of the dielectric passivation is to take place between manufacturing of the Schottky metallization (in the example of FIGS. 6A-6F, Ti) and the pad/contact metallization (in the example of FIGS. 6A-6F, AlCu). The Schottky metallization may be uncovered and exposed to the influences of dry-chemical etching. The unprotected Ti may degrade, and consequently, the Schottky interface may be affected. Thus, there may be a need for protecting the Schottky metallization during dry-chemical patterning.

In some examples, an edge termination for semiconductor elements with high electric field strengths in the edge may be introduced which decisively improves robustness against moisture by supplementing a purely organic passivation layer with a dielectric passivation. The dielectric passivation may serve to protect the edge termination (e.g. of the SiC diode) from moisture/humidity. With this form of passivation, the inorganic passivation may be patterned via the imide which means that the porous inorganic oxide/nitride passivation lies above the AlCu metallization (see FIGS. 2, 4, and 5). This may be a possible solution for packages including soft mold in which mechanical stress might not occur between the semiconductor device and the mold material.

For other packages (molded packages or plastics packages) in which mechanical stresses occur between mold material, passivation and Al-based front-side material in particular due to temperature increases, this approach might not work. The stress resulting from thermal changes causes mechanical stress cracks in the inorganic passivation structure. Moisture-robust members are desired as a so-called "hard mold" or "mold compound" may offer insufficient protection against moisture. For diodes merely comprising an imide passivation in connection with a homogenously doped junction termination edge (JTE), an oxidation of the external area of the JTE may be detected as a consequence of high humidity. The remaining blocking capacity of the device may be sufficient for some applications, but not all (e.g. automotive applications).

In some examples, an inorganic passivation for plastics packages may be patterned after the manufacturing of the front-side metallization via an additional mask (e.g. the Ti Schottky and AlCu pads, see FIGS. 2, 4, and 5). Thus, the passivation is spatially separated from the AlCu edge and no cracks are formed with thermal stresses in the package. In this case, the Ti Schottky metal may be protected from the influences of dry-chemical etching by the AlCu metallization. However, in this case the passivation is deposited via the AlCu edge and also to be etched in this area. This may be possible up to AlCu thicknesses of 5 microns. However, the thicker the front side metallization is, the more critical this becomes as the resist has to be led over the edge; as AlCu thickness increases, so too does the resist thickness. In order to improve the i$^2$T performance (a measure of the surge current strength) of the diode, or the short-circuit performance of the MOSFET, a larger heat sink may be provided by increasing the thickness of the metallization. The thicker the AlCu metallization gets, the more difficult it may be to process the dielectric passivation over this step.

High topologies may be avoided by generating the dielectric passivation between the Schottky metallization and the pad metallization. An example for a Schottky SiC diode is shown in FIGS. 6A-6F. This might not be accomplished by simply putting the passivation in between. The Ti—SiC Schottky barrier may be affected by the dry-chemical etching process such that leakage currents can be strongly increased.

In some approaches, a silicon nitride/silicon oxide (SiNx/SiOx) passivation may be used in the edge area. In these cases, the passivation may be formed either before the deposition of the Ti—Al(Cu) metallization or between the Ti and AlCu process blocks. The passivation may be in contact with the metallization, which may lead to problems of adhesion or, in the case of a thermal stress, to cracks in the passivation.

The Schottky contact degradation may be improved by providing a buffer layer above the Ti layer which may absorb the influences of any process steps between Schottky and pad metallization (e.g. dry etching processes). A TiAl3 layer may serve in this respect for several reasons: 1) as for productive diodes, Ti may be used as a Schottky metal, Al may be deposited in situ by means of an appropriate tool. Thus, the SiC—Ti interface may be identical to the production goods. 2) In a tempering act, the TiAl3 formation may be set very accurately, forming a strong adhesion between the Ti and TiAl3 layers with a smooth uninterrupted transition. 3) The TiAl3 forms an etch stop for AlCu etching. Thus, no undercuts may result below the passivation (see FIG. 6E). A sufficient distance between the AlCu and passivation may be maintained (e.g. 3-5 microns).

To keep the electric field strength compatible with the mold material, an additional organic passivation may be used which encapsulates the complete inorganic (silicon oxide-silicon nitride) passivation and also absorbs part of the mechanical stress. Thus, the amount of the electric field strength at the interface of the inorganic to the organic passivation may be >500 kV/cm due to the thickness of the inorganic passivation. The organic passivation may be dimensioned such that at its surface, which represents the interface to the mold material, the amount of the electric field strength may be reduced so that a degradation of the mold material and/or rollovers within the same may be excluded. The thickness of the organic passivation may be in a range from 5 microns (e.g. for 650V devices) to 20 microns (e.g. for 2 kV devices).

For example, a TiAl3 layer may be used that acts as both a buffer layer and as an etch stop layer. The TiAl3 may be generated by a tempering act from a Ti—Al layer sequence. The proportion of these layers may be selected so that a Ti layer which forms the Schottky barrier is maintained up to the semiconductor body and above the Ti layer a TiAl3 layer is formed. The TiAl3 layer may serve as a buffer layer for material remaining from dry-chemical etching (e.g. fluorine). This might not refer to contaminations which come to lie on top of the TiAl3 (e.g. polymers). The Ti Schottky metallization can thus be protected so that it is not affected. The TiAl3 layer may also serve as an etch stop layer in wet-chemical patterning of the AlCu metallization. Thus, no under-etching of the dielectric passivation may result.

Some examples relate to the implementation of a TiAl3-buffer layer to protect the Ti-Schottky layer of a SiC diode for subsequent dry chemical etching processes during the manufacturing of moisture robust and thermally robust SiC devices.

FIGS. 6A-6F show schematic cross-sections of a part of a SiC diode comprising a TiAl3 barrier sublayer. For example, the implementation of the SiC diode may be similar to the semiconductor devices described in connection with FIGS. 1 and/or 2, for example.

Figure 6A:
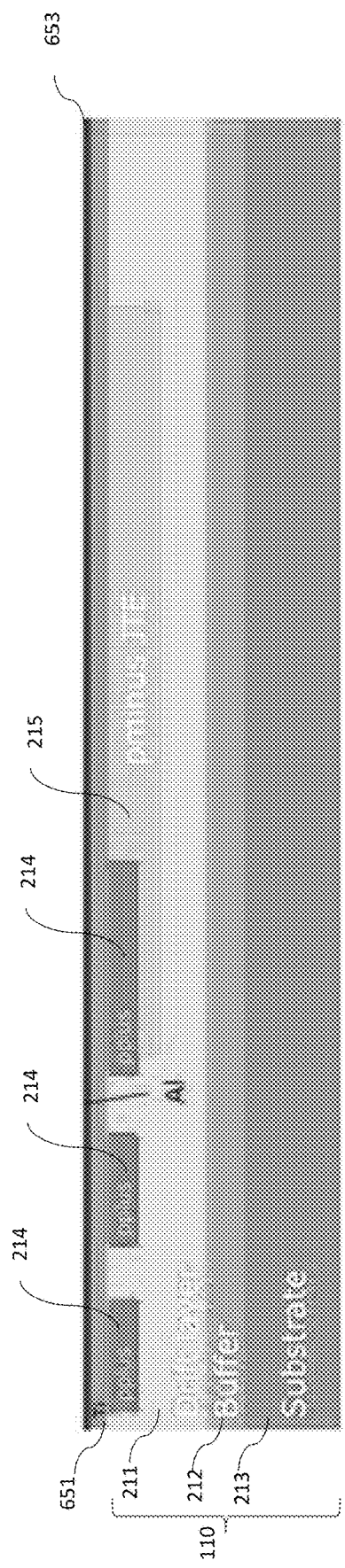
FIG. 6A-6F show respective schematic cross-sections of a part of a silicon carbide diode device comprising a TiAl3 buffer sublayer.

FIG. 6A shows a schematic cross-section of a part of a SiC diode after depositing a titanium and aluminum metallization. For example, a first barrier sublayer 651 is deposited over the semiconductor substrate 110 and an intermediate barrier layer 653 is deposited over the first sublayer 651. The first sublayer 651 is a Ti layer and the intermediate layer 653 is an Al layer. The first barrier sublayer 651 and the intermediate layer 653 may be deposited in a Ti—Al thickness ratio chosen such that, after tempering (see FIG. 6C), the remaining Ti and resulting TiAl3 layers are sufficiently thick to avoid fractures from stress. For example, a 2-to-1 (or 1.5-to-1 or 3-to-1) ratio of Ti-to-Al may be deposited (e.g. 180 nm Ti layer and a 90 nm Al layer).

Figure 6B:
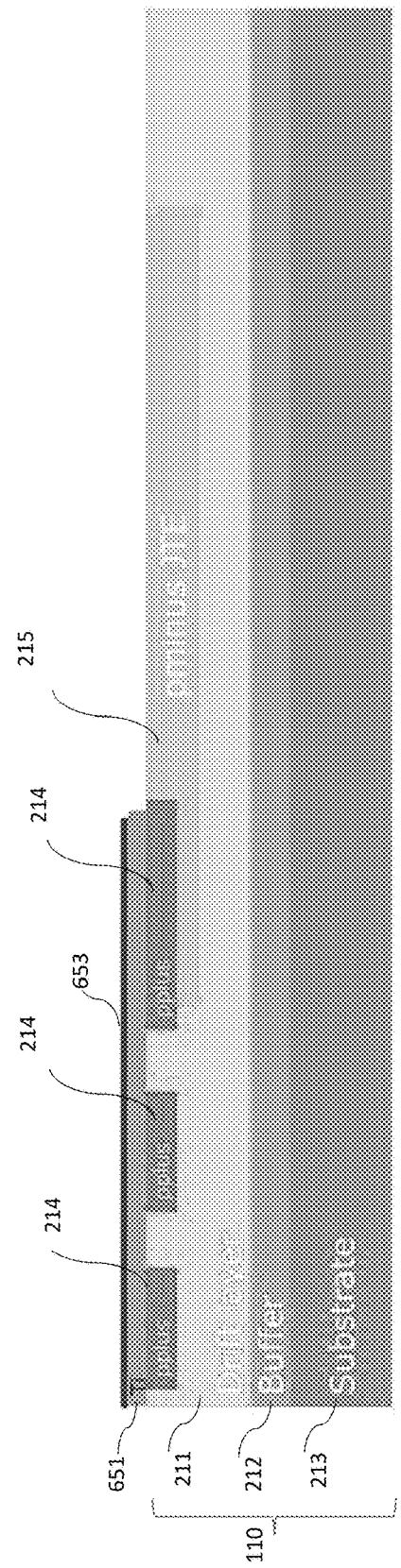

FIG. 6B shows the first sublayer 651 and the intermediate layer 653 after the two layers are structured.

Figure 6C:
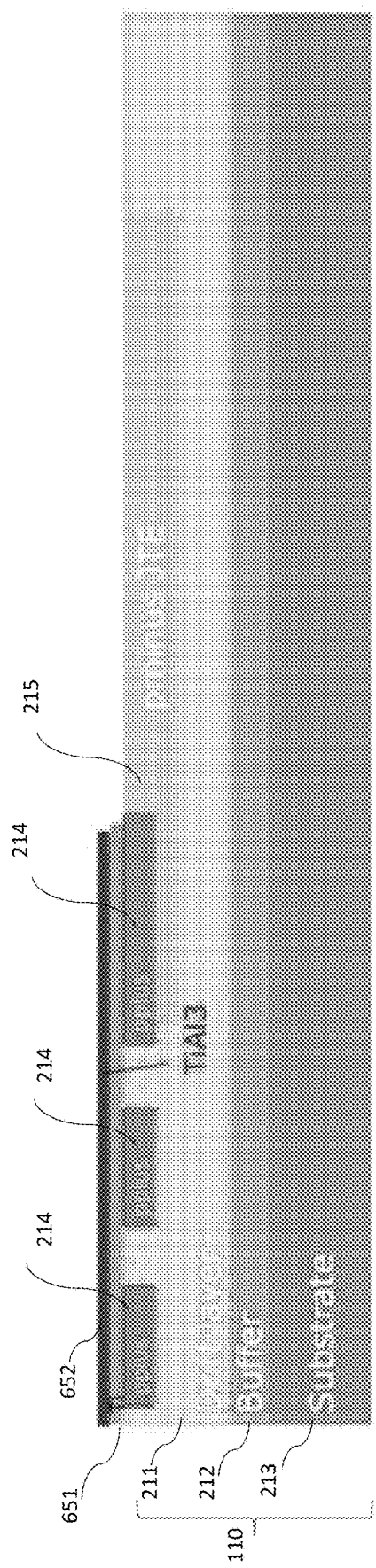

FIG. 6C shows the SiC diode after tempering and forming of a TiAl3 layer. By adjusting the time, temperature, and/or pressure accordingly, the Ti and Al layers may be tempered, causing the intermediate layer 653 to react with the first barrier sublayer 651 and convert from Al into a second barrier sublayer 652 comprising a TiAl alloy layer (e.g. TiAl3 layer). After tempering, assuming an initial 180 nm Ti and 90 nm Al layer, this may result in an approximately 120 nm TiAl3 layer acting as a buffer layer to absorb incorporations from dry etch processes and a 150 nm Ti layer acting as Schottky metal/interface as a productive diode. For example, rapid thermal processing may be used for the TiAl3 formation.

Figure 6D:
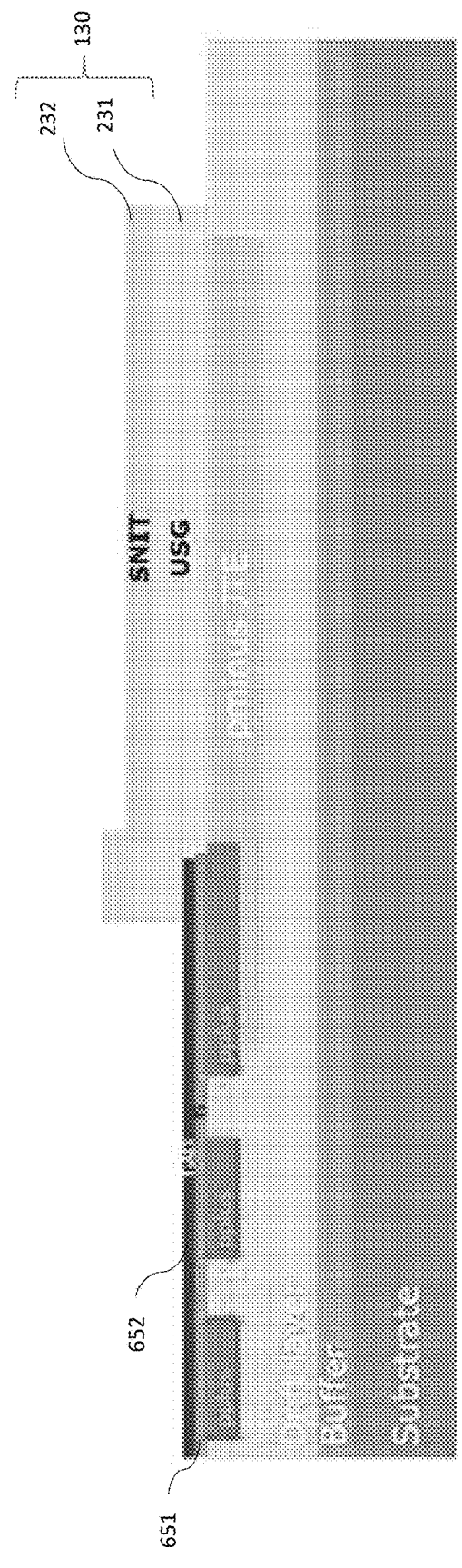

FIG. 6D shows the SiC diode after the deposition and structuring of a silicon nitride—silicon oxide passivation forming the inorganic passivation structure. The inorganic passivation structure 130 comprises a silicon oxide layer 231 with a thickness of at least 500 nm thick (or at least 800 nm or at least 1000 nm) and a silicon nitride layer 232 with a thickness of at least 200 nm thick (or at least 300 nm or at least 400 nm). For structuring the inorganic passivation structure, a photo mask layer may be formed and lithography may be performed. Then, the inorganic passivation structure may be etched by a dry etch process. Afterwards, the resist and/or polymer may be removed.

The inorganic passivation structure may be deposited and patterned over the first sublayer 651 without degrading the Schottky interface of the first sublayer 651 because the second sublayer 652 protects the first sublayer 651 from the dry etch process. In this way, it can be possible to form the inorganic passivation structure before the metallization layer is formed.

Figure 6E:
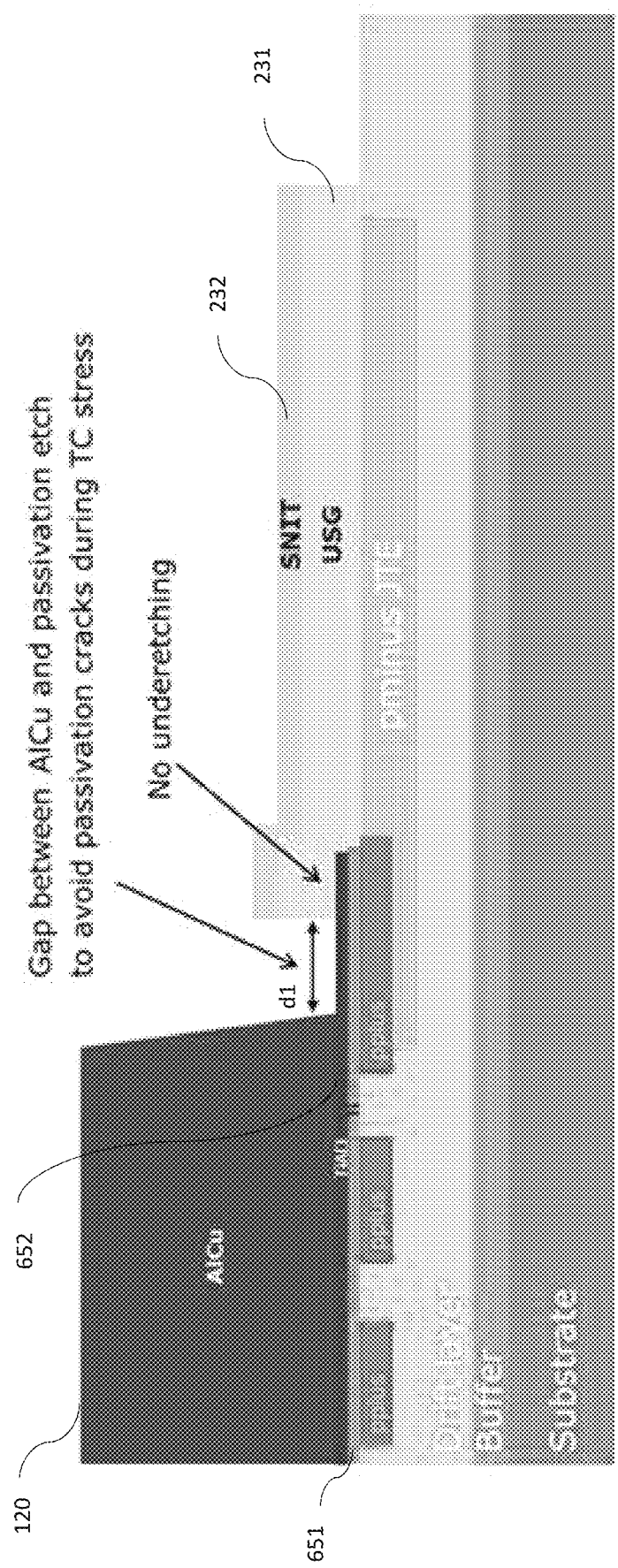

FIG. 6E shows the SiC diode after deposition and patterning of an AlCu pad metallization (e.g. contact metallization layer 120). The AlCu front side metallization may be deposited and an etching mask may be formed by lithography. The contact metallization layer 120 may be patterned by wet chemical etching which may remove the AlCu layer but does not remove the TiAl3 layer. Thus, no under-etching of the inorganic passivation structure, for example the silicon oxide layer 231, may occur. As in other examples discussed herein, a gap d1 is maintained between the AlCu layer and the passivation to avoid passivation cracks during thermal-mechanical stress.

Figure 6F:
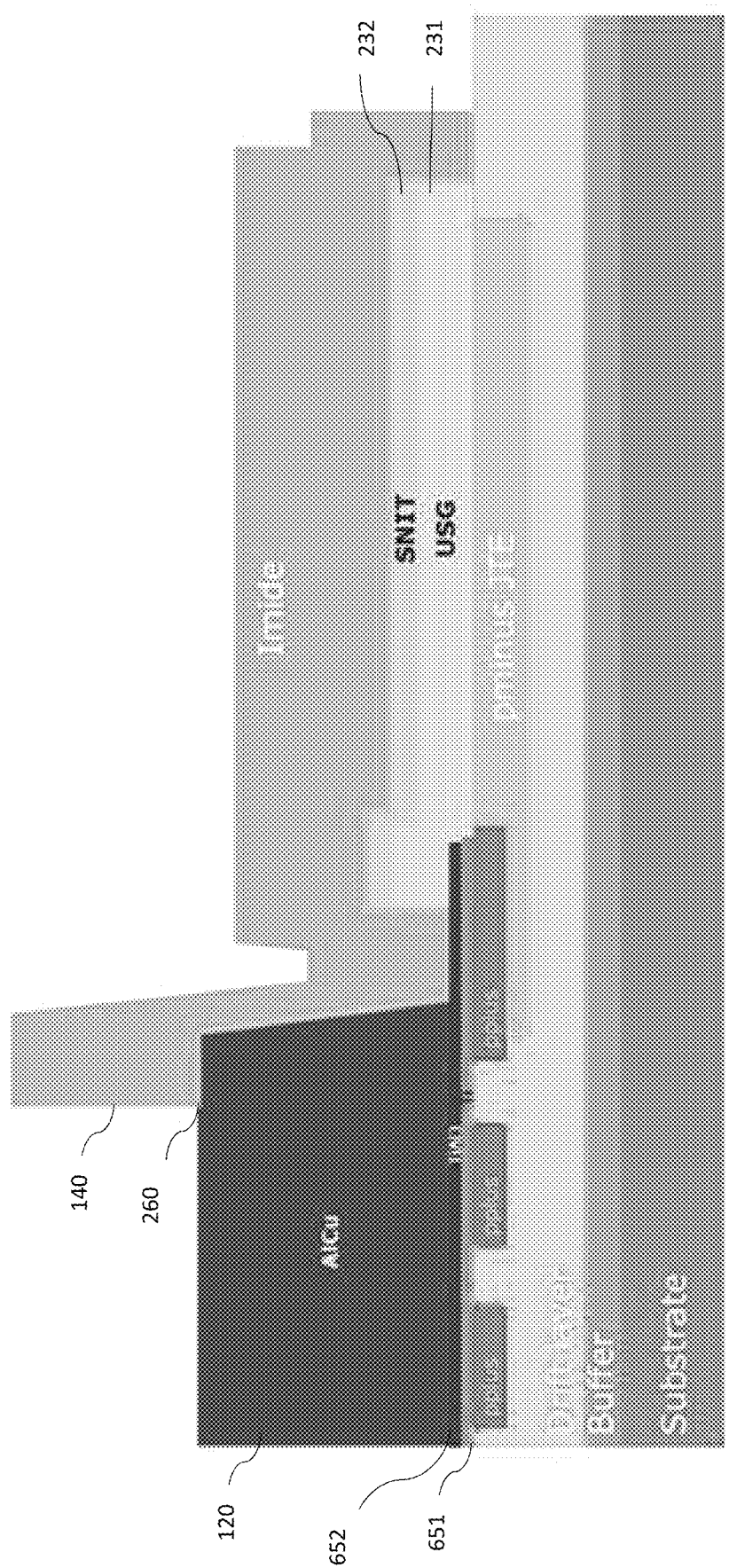

FIG. 6F shows the SiC diode after finishing the imide passivation (implementing an organic passivation layer) and etching of the adhesion layer passivation. An adhesion layer 260 (e.g. with a thickness of 40 nm) is deposited after forming the contact metallization layer 120 and an organic passivation layer 140 (e.g. an imide layer with a thickness of 5 μm) is deposited on the adhesion layer 260. Then the organic passivation layer 140 and the adhesion layer 260 are structured and the surface is cleaned.

More details and aspects are mentioned in connection with the proposed concept or one or more examples described above or below. The method may comprise one or more additional optional features corresponding to one or more aspects of the proposed concept or one or more examples described above (e.g. FIGS. 1-5) or below (e.g. FIGS. 7A-9).

Some examples relate to a semiconductor device comprising a barrier layer comprising a first sublayer and a second sublayer. The first sublayer may be a TiAl alloy layer and the second sublayer may be a Ti layer. Further, the semiconductor device comprises a contact metallization layer comprising aluminum (e.g. AlCu, AlSiCu or AlSi). At least a part of the barrier layer may be located between the contact metallization layer and a semiconductor substrate of the semiconductor device. Further, at least a part of the first sublayer of the barrier layer is in contact with the second sublayer and in contact with the contact metallization layer.

More details and aspects are mentioned in connection with the proposed concept or one or more examples described above or below.

Some examples relate to a method for forming a semiconductor device comprising forming a barrier layer comprising a first sublayer and a second sublayer. The first sublayer may be a Ti layer and the second sublayer may be a TiAl alloy layer. Further, the method comprises forming a contact metallization layer comprising aluminum (e.g. AlCu, AlSiCu or AlSi). At least a part of the barrier layer may be located between the contact metallization layer and a semiconductor substrate of the semiconductor device. Further, at least a part of the second sublayer of the barrier layer is in contact with the first sublayer and in contact with the contact metallization layer.

For example, an inorganic passivation structure may be formed before the contact metallization layer. In this way, a deposition of the inorganic passivation structure on a surface with high topology due to the contact metallization layer may be avoided.

The TiAl alloy layer may be a TiAl3-layer. The TiAl3-layer may be formed with a thickness of at least 80 nm (or at least 100 nm) and/or at most 400 nm (or at most 300 nm or at most 200 nm). The TiAl3-layer may be formed at a temperature of at least 300° C. (or at least 350° C., e.g. 400° C.) applied for at least 1 h (or at least 5 h) and/or at most 20 h (or at most 15 h).

More details and aspects are mentioned in connection with the proposed concept or one or more examples described above or below.

High humidity may cause a problem of a degradation of the edge of SiC MOSFETs. In some cases, it may be necessary to protect the semiconductor body from moisture.

Some approaches may use a SiNx/SiOx passivation in the edge area. In these approaches, the passivation may be either realized before the deposition of the Ti—Al(Cu) metallization or between Ti and AlCu process block. The passivation may be in contact with the metallization, which may lead to problems of adhesion or, in case of a thermomechanical stress, to cracks in the passivation. In some approaches, processing, and consequently, also the cross-section, of SiC diodes may deviate as compared to a SiC MOSFET. Further, these approaches may include a homogenously doped edge termination and no p-in-p termination decreasing the field in the edge.

The problem of a moisture permeable edge passivation for SiC MOSFETs may be solved by manufacturing the passivation after the AlCu/Ti—TiN process blocks. The layout may be selected so that a sufficiently large distance between the AlCu edge and the passivation is established, but the edge termination of the MOSFET may be completely covered by the dielectric passivation. As compared to the diode, processing, and thus also the cross-section, may be different as the edge area may be covered by a gate oxide (GOX) and/or an interlayer dielectric layer (ILD). Thus, it may no longer be necessary to deposit an oxide/nitride passivation (as in the case of diodes). Rather, ILD+GOX may serve as the silicon oxide layer, and only a nitride layer may be used. On the functioning of the layers: the silicon nitride layer may serve as the actual moisture barrier; the silicon oxide layer may serve as an adhesion layer to SiC. The same may be selected sufficiently thick to minimize the influence of changes at the silicon oxide-silicon nitride interface onto the charge balance in the edge. As the inorganic silicon oxide-silicon nitride passivation layers might not be drawn across the AlCu metallization, and MOSFETs may be mounted in soft mold modules, thicknesses may be reduced accordingly and an oxide thickness at least 300 nm (or 400 nm or 500 nm) and at most 1000 nm (or 800 nm or 500 nm) may be sufficient.

To keep the electric field strength compatible with the mold material, an additional organic passivation may be used which encapsulates the complete silicon oxide-silicon nitride passivation and also absorbs part of the mechanical stress. Thus, e.g., the amount of the electric field strength at the interface of the inorganic to the organic passivation may be >500 kV/cm due to the thickness of the inorganic passivation. The organic passivation may be dimensioned such that at its surface, which represents the interface to the mold material, the amount of the electric field strength may be reduced so that a degradation of the mold material and/or rollovers within same may be excluded. The thickness of the organic passivation in turn may be selected so that the forces caused by thermal expansion do not lead to crack formation within the same or within subsequent layers.

If the inorganic hard passivation is selected such that only the edge termination is covered, the area covered by the inorganic hard passivation may be reduced and consequently a reduction of the voltages in the SiC oxide/nitride layer setup may be acquired. To guarantee adhesion of the organic passivation on the front-side metal in this case, a thin adhesive layer may be used which covers both the front-side metal below the imide and also the inorganic passivation.

An edge construction for SiC MOSFETs may be introduced. The passivation may be selected so that the GOX and ILD, in connection with an additionally deposited silicon oxide/silicon nitride layer, form the dielectric passivation to the moisture barrier. In some examples, a silicon oxide layer may be optional (not mandatory). To reduce or exclude crack formation in the inorganic passivation, the distance between the AlCu edge and silicon oxide-silicon nitride passivation may be sufficiently large. To further decrease electric fields in the passivation an imide passivation may be used. A thin silicon nitride adhesive layer may serve for an improved adhesion of the same.

With this combination of inorganic and organic layers, both the mechanical requirements of package forms with hard mold and also requirements of robustness against moisture for modern semiconductor devices and their fields of use may be met.

This passivation may be used independent of the actual edge construction within the semiconductor. Thus, for example, for JTEs, where the p-doping is guided homogenously around the device in a ring structure, but also for so called p-in-p-JTE, where the field strengths may be clearly reduced in the edge of the device both in the semiconductor and also in the area of the passivation above the semiconductor body.

Some examples relate to manufacturing methods for moisture robust and thermally stable junction termination p-in-p edges for SiC-MOSFETs. Some examples of SiC-MOSFETs comprising an intermediate oxide layer (e.g. comprising ILD+GOX layers) are described in the following. In the example shown in FIGS. 7A-7C, only a silicon nitride layer (as inorganic passivation structure) is deposited onto the ILD+GOX. In the example shown in FIGS. 8A-8C, an optional thin silicon oxide layer is present. In the example shown in FIG. 9, the barrier layer extends across the edge termination region.

Figure 7A:
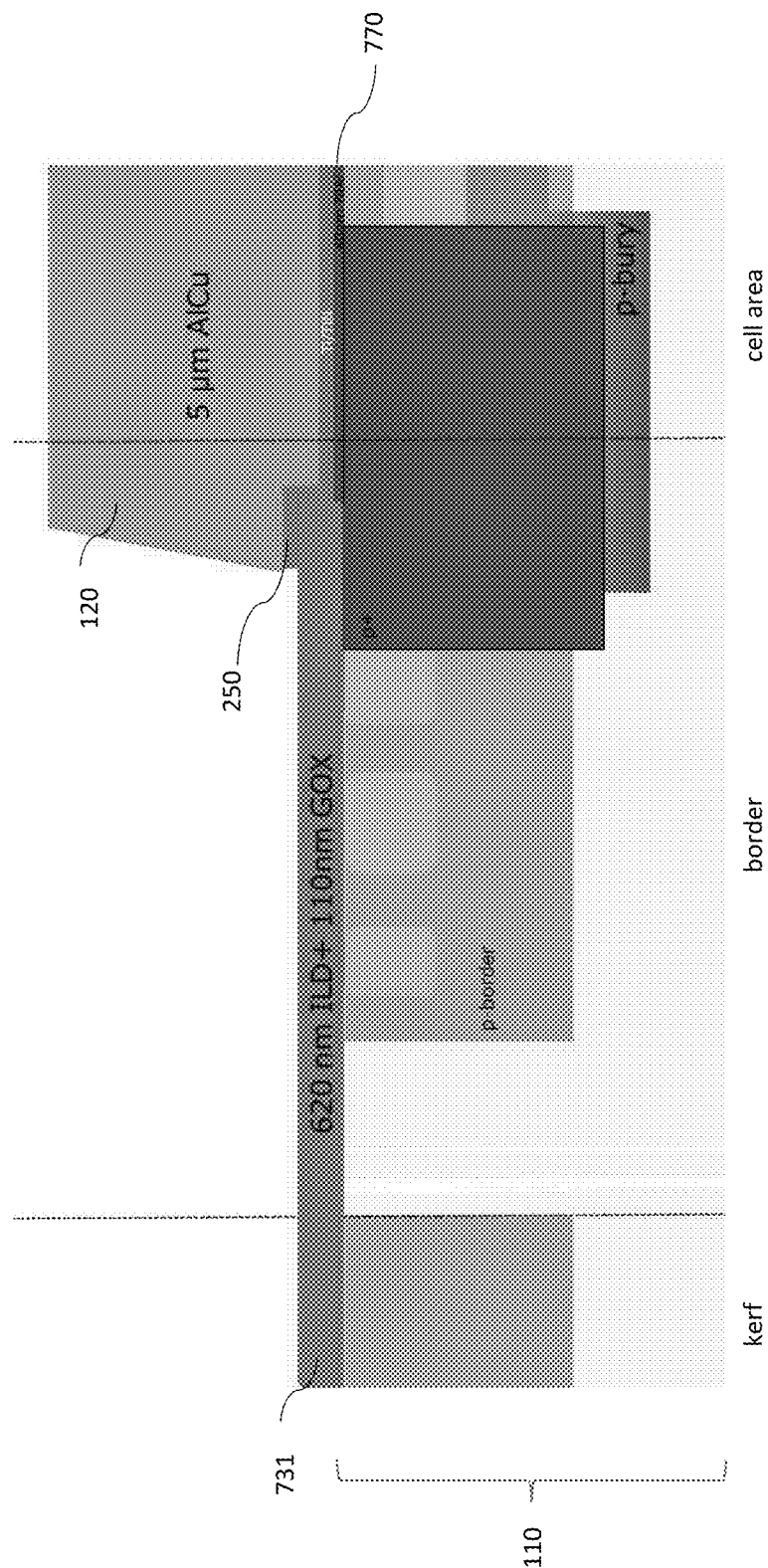
FIG. 7A-7C show respective schematic cross-sections of a part of a silicon carbide device comprising an intermediate oxide layer.
Figure 7B:
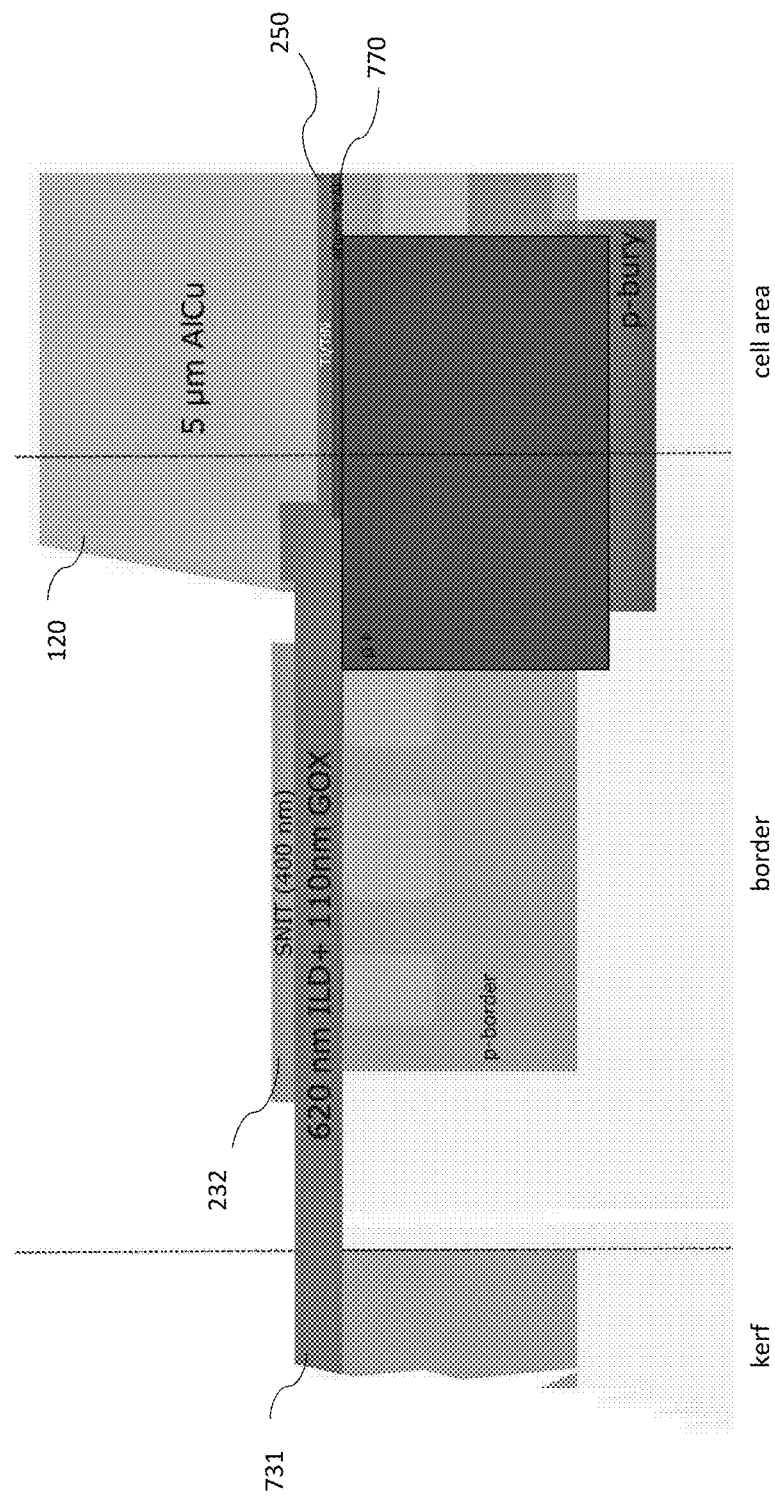
Figure 7C:
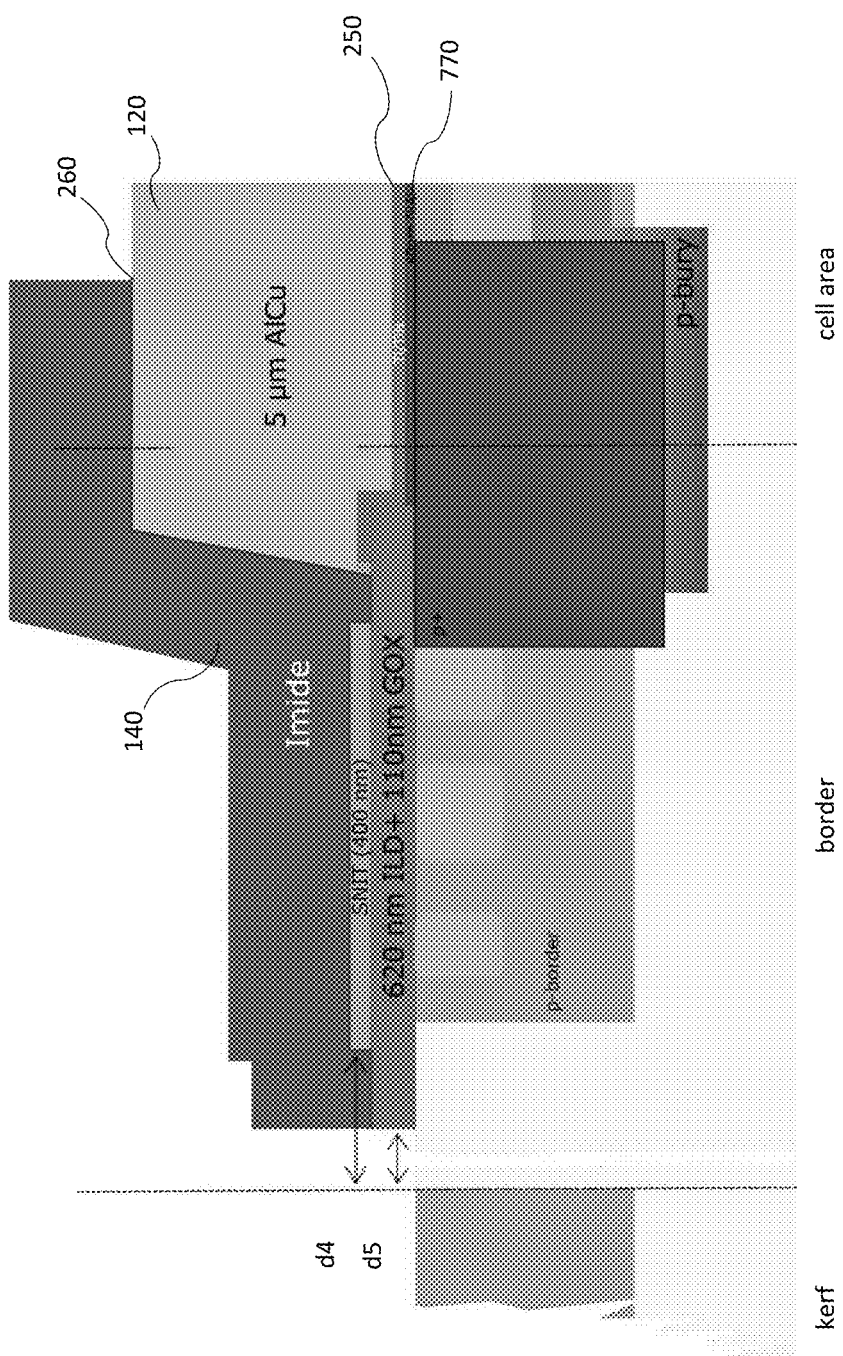

FIGS. 7A-C show schematic cross-sections of a part of a SiC MOSFET comprising an intermediate oxide layer and a p-in-p edge termination structure. The implementation of the SiC MOSFET may be similar to the implementation of the semiconductor devices described in connection with FIGS. 1, 2 and/or 6A-6F, for example.

FIG. 7A shows a schematic cross-section of a SiC MOSFET by deposition and patterning of the front side metallization (e.g. after AlCu wet and Ti/TiN dry etch). The SiC MOSFET comprises a SiC substrate 110, a contact metallization layer 120 (e.g. AlCu layer with a thickness of 5 μm), a barrier layer 250, an intermediate oxide layer 731, and an ohmic contact layer 770.

In this example, the barrier layer 250 may comprise a Ti layer and/or a TiN layer. A first lateral part of the barrier layer 250 may be vertically in contact with the contact metallization layer 120 on one side and an ohmic contact layer 770 on an opposite side. A second lateral part of the barrier layer 250 may be vertically in contact with the contact metallization layer 120 on one side and the intermediate oxide layer 731 on an opposite side.

The ohmic contact layer 770 may comprise a nickel aluminum (NiAl) alloy layer. The ohmic contact layer 770 may have a thickness of at least 20 nm and at most 60 nm. The ohmic contact layer 770 may be vertically in contact with the barrier sublayer 250 on one side and with the SiC substrate 110 on an opposite side.

The intermediate oxide layer 731 may comprise an ILD layer and a GOX layer. The intermediate oxide layer 731 may be formed before the contact metallization layer 120. At least a part of the intermediate oxide layer 731 may be located vertically between the contact metallization layer 120 (and/or the barrier layer 250) and the SiC substrate 110.

FIG. 7B shows a schematic cross-section of the SiC MOSFET after deposition and patterning of the inorganic passivation nitride layer (e.g. after silicon nitride deposition with a thickness of 400 nm, etching and resist removal and surface cleaning). A silicon nitride layer 232 may be deposited on the intermediate oxide layer 731. The silicon nitride layer 232 may be patterned via a resist mask, so that the intermediate oxide layer 731 laterally between the contact metallization layer 120 (e.g. the AlCu edge) and the inorganic passivation structure (e.g. silicon nitride layer 232) is not removed or etched. In other words, the intermediate oxide layer 731 may be used as etch stop for the structuring of the silicon nitride layer 232.

FIG. 7C shows a schematic cross-section of the SiC MOSFET after completion of the organic passivation, opening of the silicon nitride adhesion layer 260 and etching the ILD+GOX in the edge region (e.g. after adhesion layer 260 HSP deposition with a thickness of 40 nm and imide process block). A part of the organic passivation layer 140 may be arranged in the gap laterally between the contact metallization layer 120 and the silicon nitride layer 232 (e.g. analogous to that shown in FIGS. 1 and 2). A distance d4 from a lateral edge of the silicon nitride layer 232 to an edge of the SiC MOSFET may be larger than a distance d5 from a lateral edge of the intermediate oxide layer 731 to an edge of the SiC MOSFET.

After the deposition and patterning of the front-side metal (see FIG. 7A) the silicon nitride layer 232 is deposited. Subsequently, the same is patterned via a resist mask. For example, the etching process is selective, so that between passivation and AlCu edge the ILD+GOX is not etched. After removing the resist mask and cleaning the surface (see FIG. 7B), deposition of the adhesive layer 260 may be executed (40 nm silicon nitride) and then the manufacturing of the imide passivation. Subsequently, the adhesive layer 260 may be opened via the imide mask and finally etching the ILD+GOX in the external edge area may be executed (see FIG. 7C). After cleaning the surface, the front-side process may be completed.

More details and aspects are mentioned in connection with the proposed concept or one or more examples described above or below. The SiC MOSFET may comprise one or more additional optional features corresponding to one or more aspects of the proposed concept or one or more examples described above (e.g. FIGS. 1-6F) or below (e.g. FIGS. 8A-9).

Figure 8A:
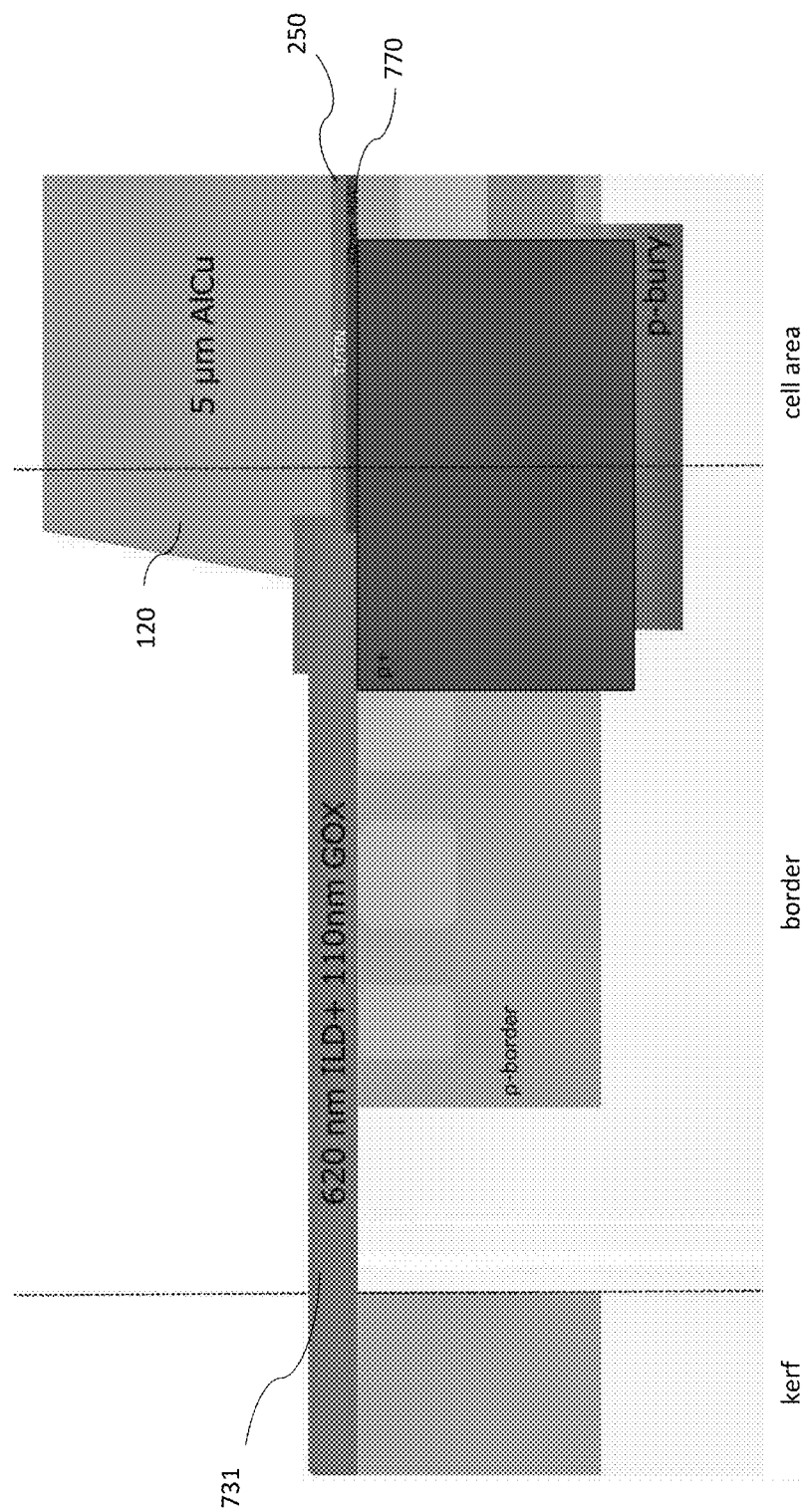
FIG. 8A-8C show respective schematic cross-sections of a part of a second silicon carbide device comprising an intermediate oxide layer.
Figure 8B:
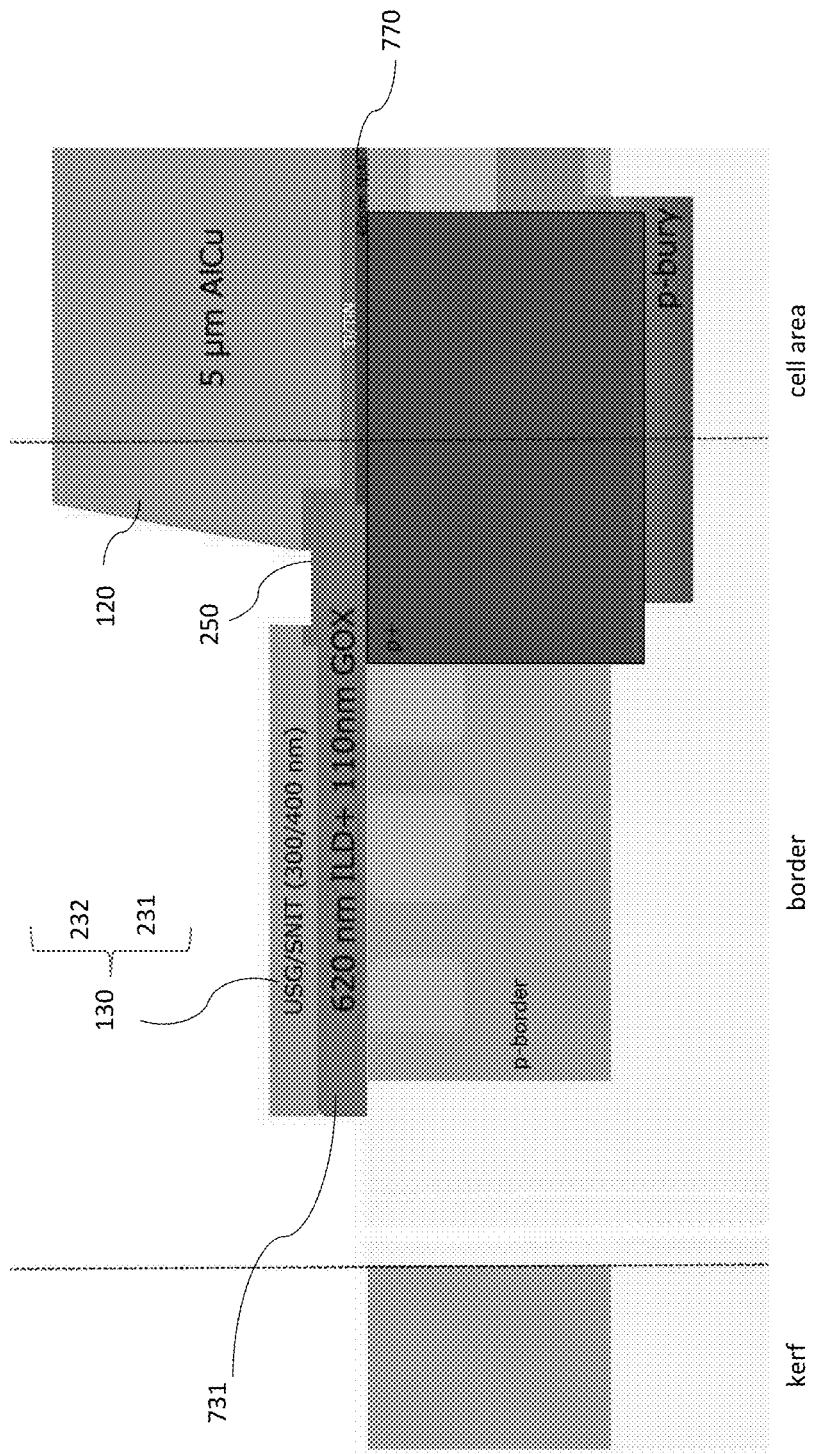
Figure 8C:
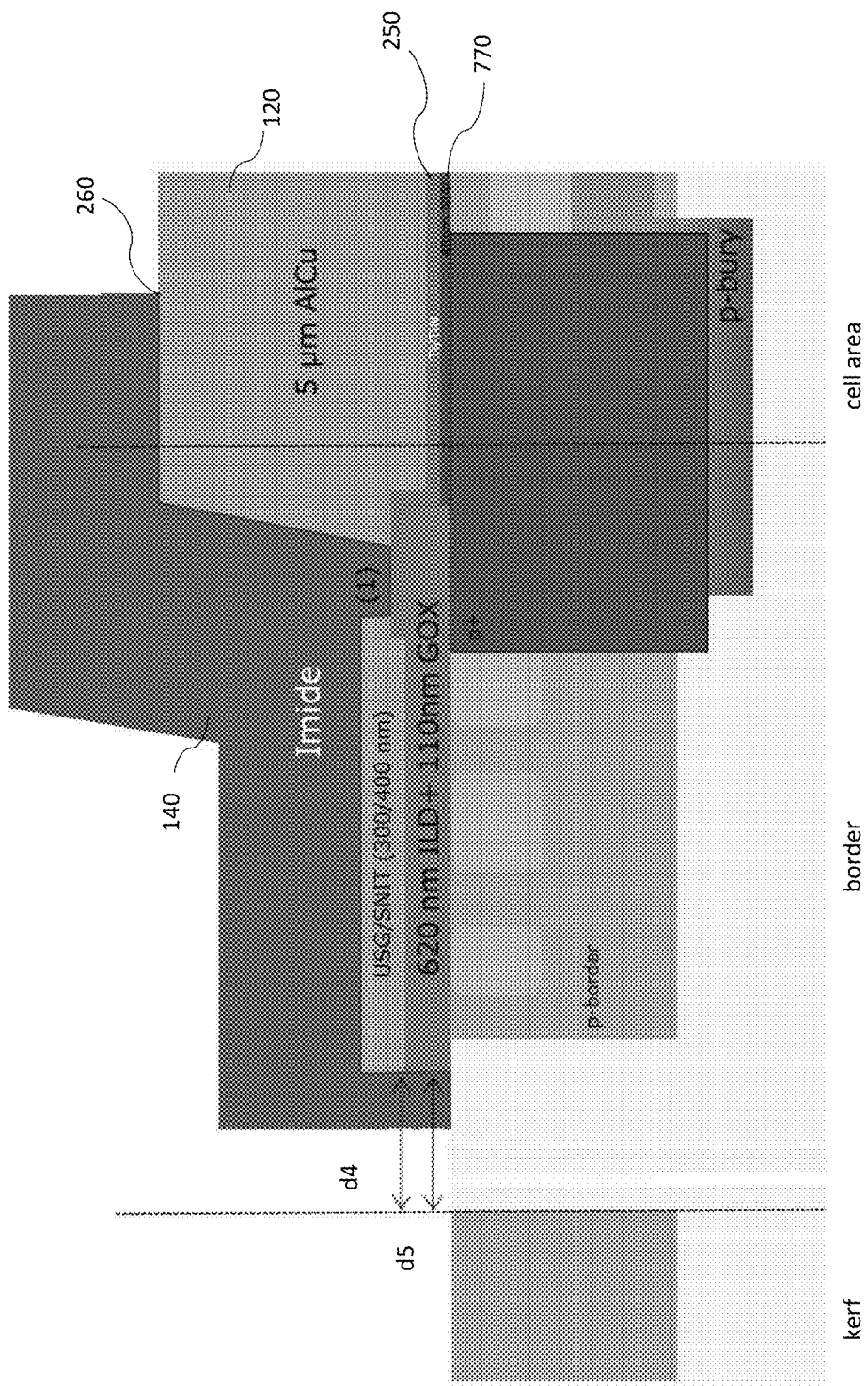

FIGS. 8A-C show schematic cross-sections of a part of a SiC MOSFET comprising an intermediate oxide layer and a p-in-p edge termination structure. The implementation of the SiC MOSFET may be similar to the implementation of the semiconductor devices described in connection with FIG. 1, 2, 6A-6F and/or 7A-7C, for example.

FIG. 8A shows a schematic cross-section of a SiC MOSFET after deposition and patterning of the front-side (e.g. after AlCu wet and Ti/TiN dry etch with additional mask). In contrast to FIG. 7A, the Ti/TiN layer is patterned via an extra mask so that the Ti/TiN layer can extend farther along the intermediate oxide layer 731 than the contact metallization layer 120. Thus, the Ti/TiN layer 250 may serve as an etch stop for the subsequent silicon nitride/silicon oxide etching.

In other words, the barrier layer 250 may extend laterally beyond the contact metallization layer 120. This part of the barrier layer 250 (e.g. that part which is not in contact with the contact metallization layer 120) may act as an etch stop during a subsequent etching of the silicon nitride 232/silicon oxide 231 layers (e.g. inorganic passivation structure).

FIG. 8B shows a schematic cross-section of a SiC MOSFET after deposition and patterning of the inorganic passivation layers (e.g. after passivation etch, resist removal and surface cleaning). In contrast to FIGS. 7A-7C, the inorganic passivation structure 130 of FIGS. 8A-8C further comprises a silicon oxide layer 231. As shown in FIG. 8B, the intermediate oxide layer 731 (ILD and GOX layer) has been etched at the edges (together with the silicon nitride layer and the silicon oxide layer of the inorganic passivation structure). The intermediate oxide layer 731 located beneath the Ti/TiN barrier layer 250 in the gap is not etched as the Ti/TiN barrier layer 250 acts as an etch stop in this region. For example, the Ti/TiN barrier layer 250 is sufficiently thick so that it is not consumed during etching of the oxide.

FIG. 8C shows a schematic cross-section of a SiC MOSFET after completion of the organic passivation and opening of the silicon nitride adhesion layer 260. The oxide layers have already been etched, so only the adhesion layer 260 needs to be removed (at the edge of the SiC substrate).

The SiC MOSFET comprises a semiconductor substrate 110, a contact metallization layer 120, a silicon nitride 232 and silicon oxide 231 layers (e.g. an inorganic passivation structure 130), an intermediate oxide layer 731, a barrier layer 250, an organic passivation structure 140 (e.g. imide), an adhesion layer 260, and an ohmic contact layer 770. A distance d5 from a lateral edge of the intermediate oxide layer 731 to an edge of the SiC MOSFET may be equal to a distance d4 from a lateral edge of the inorganic passivation structure (from an edge of silicon nitride 232/silicon oxide 231 layers) to the edge of the SiC MOSFET.

In the example shown in FIG. 8A-8C, a silicon oxide/silicon nitride stack layer is used to realize a moisture barrier. In this way, the distance of the silicon oxide-silicon nitride interface from the edge termination of the device may be increased, and thus the influence of boundary layer charges may be further reduced.

In this example, the Ti/TiN barrier layer 250 is patterned via an extra mask. After depositing silicon oxide/silicon nitride and manufacturing a resist mask, in a subsequent step the inorganic passivation may be patterned by means of a plasma etching step and the resist may be removed again (see FIG. 8B). Here, the Ti/TiN layer in the gap between passivation and AlCu may serve as an etch stop layer. In the next process, again the deposition of the adhesive layer 260 is executed (e.g. 40 nm silicon nitride) and subsequently the manufacturing of the imide passivation. Subsequently, the adhesive layer 260 is opened via the imide mask, in contrast to example of FIG. 7A-7C, the GOX+ILD might not need to be etched again.

More details and aspects are mentioned in connection with the proposed concept or one or more examples described above or below. The SiC MOSFET may comprise one or more additional optional features corresponding to one or more aspects of the proposed concept or one or more examples described above (e.g. FIGS. 1-7C) or below (e.g. FIG. 9).

Figure 9:
FIG. 9 shows respective schematic cross-sections of a part of a third silicon carbide device comprising an intermediate oxide layer.

FIG. 9 shows schematic cross-sections of a part of another SiC MOSFET comprising an intermediate oxide layer 731. The cross-sections shown in FIG. 9 show a schematic process flow for the formation of the SiC MOSFET. The implementation of the SiC MOSFET may be similar to the implementation of the SiC device described in connection with FIGS. 8A-8C, for example.

The example shown in FIG. 9 differs from that of FIGS. 8A-8C in the structure of the barrier layer 250. The barrier layer 250 of SiC MOSFET differs from the barrier layer 250 of SiC MOSFET in its lateral extension. That is, the barrier layer 250 of the SiC MOSFET extends towards the edge region of the device at least over the p-ring structures of the p-in-p edge termination, whereas the barrier layer 250 of SiC MOSFET shown in FIGS. 8A-8C does not extend laterally beyond the outermost p-ring structure of the SiC substrate.

After forming a SiC substrate including doped regions for implementing transistor cells and an edge termination and an intermediate oxide layer 731, a Ti/TiN layer is deposited (e.g. the barrier layer 250). A lithographic mask is provided over the Ti/TiN layer. A Ti/TiN layer dry-etching takes place, removing the Ti/TiN except for that which was covered by the mask.

Next, a contact metallization layer 120 (e.g. AlCu) is deposited across the SiC substrate. Subsequently, the AlCu layer is etched. Next, an oxide layer (e.g. silicon oxide layer 231) and a nitride layer (e.g. silicon nitride layer 232) are deposited over the SiC substrate. An appropriate mask is placed (e.g. lithographic resist) and the oxide layers are then etched. The intermediate oxide layer 731 arranged vertically below the deposited oxide layers may also be etched in this same step at the edge of the SiC substrate. Then, an organic passivation layer 140 (e.g. imide) is deposited and etched.

More details and aspects are mentioned in connection with the proposed concept or one or more examples described above or below. The SiC MOSFET may comprise one or more additional optional features corresponding to one or more aspects of the proposed concept or one or more examples described above (e.g. FIGS. 1-8C) or below.

Some embodiments relate to a moisture robust device passivation with good thermal properties. A passivation structure that comprises both organic and inorganic layers may meet both the mechanical requirement of package types with hard mold and the requirements set for the robustness of modern semiconductor devices and their applications with respect to moisture.

Some other concepts introduce an edge termination for semiconductor devices with high electric field strengths in the edge that significantly improves the robustness with respect to moisture without any organic passivation layers. This may be only viable for housing forms with soft mold in which no mechanical stress can occur between the semiconductor and the mold compound. For other housings in which mechanical stress occurs between the mold compound and passivation, particularly due to increases in temperature, this might not be a solution. However, moisture-resistant components are also desired for these housing forms as a so-called "hard casting" or "mold compound" does not provide sufficient protection against moisture.

There are some concepts where a SiNx/SiOx passivation is used in the edge region, wherein, in all cases, the passivation is realized either prior to the deposition of the Ti—Al(Cu) metallization or in between the Ti and AlCu process block. That is, the passivation and metallization are in contact, which can result in difficulties, or, in case of TC stress, in cracks in the passivation.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
    a contact metallization layer that comprises aluminum and is arranged over a semiconductor substrate;
    an inorganic passivation structure arranged over the semiconductor substrate;
    an organic passivation layer comprising a first part that is arranged over the contact metallization layer, and a second part that is arranged over the inorganic passivation structure;
    a first layer structure arranged over the semiconductor substrate and comprising a first part that is in contact with the contact metallization layer, a second part that is contact with the inorganic passivation structure, and a third part that is laterally between the inorganic passivation structure and the organic passivation layer,
    wherein the first layer structure comprises an upper layer that is disposed over the contact metallization layer in the first part of the first layer structure,
    wherein the first layer structure comprises a lower layer that is disposed below the inorganic passivation structure in the second part of the first layer structure,
    wherein the lower layer is disposed underneath the contact metallization layer in the first part of the first layer structure and extends out from a lateral end of the contact metallization layer to directly adjoin with the upper layer in the third part of the first layer structure.

2. The semiconductor device of claim 1, wherein the upper layer comprises an electrical insulator.

3. The semiconductor device of claim 2, wherein the upper layer comprises silicon nitride.

4. The semiconductor device of claim 1, wherein the lower layer comprises an electrically conductive material.

5. The semiconductor device of claim 1, wherein the lower layer comprises a first layer and a second layer disposed below the first layer, wherein the first layer is a titanium alloy layer, and wherein the second layer is a titanium layer.

6. The semiconductor device of claim 1, wherein the upper layer is disposed between the contact metallization layer and the organic passivation layer in the first part of the first layer structure.

7. The semiconductor device of claim 1, wherein the lower layer is disposed between the contact metallization layer and the semiconductor substrate in the first part of the first layer structure.

8. The semiconductor device of claim 1, wherein the upper layer is disposed between the inorganic passivation layer and the organic passivation layer in the second part of the first layer structure.

9. The semiconductor device of claim 1, wherein the upper layer has a thickness of at least 100 nm and less than 300 nm.

10. The semiconductor device of claim 1, wherein a thickness of the inorganic passivation structure is at least 500 nm.

11. The semiconductor device according claim 1, wherein the inorganic passivation structure comprises at least one nitride layer with a thickness of between 300 nm and 900 nm.

12. The semiconductor device according claim 1, wherein a lateral distance between the inorganic passivation structure and the contact metallization layer is greater than a thickness of the contact metallization layer.

13. The semiconductor device according claim 1, wherein a lateral distance between the inorganic passivation structure and the contact metallization layer is less than a width of the inorganic passivation structure.

14. The semiconductor device according claim 1, wherein the organic passivation layer is a polyimide layer with a thickness of at least 1 µm and not more than 50 µm.

15. The semiconductor device according claim 1, further comprising a molding compound structure in contact with the organic passivation layer.

16. The semiconductor device according claim 1, wherein the semiconductor substrate comprises a drift region of an electrical structure comprising dopants of a first conductivity type, wherein the semiconductor substrate comprises a edge termination region, comprising dopants of a second conductivity type, wherein the edge termination region extends laterally from a contact region in the direction of a rim of the semiconductor substrate, at least partially below the inorganic passivation structure, wherein the edge termination region is ohmically connected to the contact metallization layer.

17. A semiconductor device comprising:
a contact metallization layer that comprises aluminum and is arranged over a semiconductor substrate;
an inorganic passivation structure arranged over the semiconductor substrate;
an organic passivation layer comprising a first part that is arranged over the contact metallization layer, and a second part that is arranged over the inorganic passivation structure;
a first layer structure comprising a first part that is in contact with the contact metallization layer, a second part that is contact with the inorganic passivation structure, and a third part that is arranged over the semiconductor substrate laterally between the inorganic passivation structure and the organic passivation layer,
wherein the first layer structure comprises an upper layer that is disposed over the contact metallization layer in the first part of the first layer structure,
wherein the first layer structure comprises a lower layer that is disposed below the inorganic passivation structure in the second part of the first layer structure,
wherein the upper layer comprises an electrical insulator,
wherein the lower layer comprises an alloy of titanium.

18. A semiconductor device comprising:
a contact metallization layer that comprises aluminum and is arranged over a semiconductor substrate;
an inorganic passivation structure arranged over the semiconductor substrate;
an organic passivation layer comprising a first part that is arranged over the contact metallization layer, and a second part that is arranged over the inorganic passivation structure;
a first layer structure comprising a first part that is in contact with the contact metallization layer, a second part that is contact with the inorganic passivation structure, and a third part that is arranged over the semiconductor substrate laterally between the inorganic passivation structure and the organic passivation layer,
wherein the first layer structure comprises an upper layer that is disposed over the contact metallization layer in the first part of the first layer structure,
wherein the first layer structure comprises a lower layer that is disposed below the inorganic passivation structure in the second part of the first layer structure,
wherein the inorganic passivation structure comprises at least one silicon oxide layer with a thickness between 300 nm and 5 microns.

\* \* \* \* \*

UNITED STATES PATENT AND TRADEMARK OFFICE
CERTIFICATE OF CORRECTION

PATENT NO. : 11,842,938 B2
APPLICATION NO. : 17/538162
DATED : December 12, 2023
INVENTOR(S) : J. Konrath et al.

Page 1 of 1

It is certified that error appears in the above-identified patent and that said Letters Patent is hereby corrected as shown below:

On the Title Page

Item (57) abstract (Line 9), please change "is contact" to -- is in contact --.

In the Claims

Column 22, Line 21 (Claim 1, Line 13), please change "is contact" to -- is in contact --.

Column 23, Line 18 (Claim 16, Line 4), please change "a edge" to -- an edge --.

Column 23, Line 37 (Claim 17, Line 12), please change "is contact" to -- is in contact --.

Column 24, Line 23 (Claim 18, Line 12), please change "is contact" to -- is in contact --.

Signed and Sealed this
Fifth Day of March, 2024

Katherine Kelly Vidal
*Director of the United States Patent and Trademark Office*